US005526319A

United States Patent [19]
Dennard et al.

[11] Patent Number: 5,526,319
[45] Date of Patent: Jun. 11, 1996

[54] MEMORY WITH ADIABATICALLY SWITCHED BIT LINES

[75] Inventors: Robert H. Dennard, New Rochelle; David J. Frank, Yorktown Heights, both of N.Y.

[73] Assignee: International Business Machines Corporation, Armonk, N.Y.

[21] Appl. No.: 381,791

[22] Filed: Jan. 31, 1995

[51] Int. Cl.⁶ ..................................................... G11C 7/00
[52] U.S. Cl. ........................ 365/226; 365/205; 365/227
[58] Field of Search .................................. 365/226, 149, 365/189.09, 190, 210, 205, 227

[56] References Cited

U.S. PATENT DOCUMENTS

| | | | |
|---|---|---|---|
| 4,330,853 | 5/1982 | Heimeier et al. | 365/227 |
| 4,658,382 | 4/1987 | Tran et al. | 365/203 |
| 4,893,277 | 1/1990 | Kajigaya | 365/205 X |
| 5,113,372 | 5/1992 | Johnson | 365/205 |
| 5,140,557 | 8/1992 | Yoshida | 365/226 |
| 5,157,629 | 10/1992 | Sato et al. | 365/201 |
| 5,175,706 | 12/1992 | Edme | 365/226 |
| 5,267,201 | 11/1993 | Foss et al. | 365/189.09 |
| 5,267,218 | 11/1993 | Elbert | 365/226 |
| 5,295,111 | 3/1994 | Tsujimoto | 365/226 |
| 5,420,823 | 5/1995 | Yonaga | 365/226 |

FOREIGN PATENT DOCUMENTS 57-172587  10/1982  Japan ............................. G11C 11/34

OTHER PUBLICATIONS

J. G. Koller et al., "Adiabatic Switching, Low Energy Computing, and the Physics Of Storing and Erasing Information", Workshop on Phys. and Comp. Phys. Comp. 92, IEEE pp. 267–271.

W. C. Athas et al., "An Energy–Efficient CMOS Line Driver . . . ", U of So. Calif., Info. Sci. Inst., Marina del Ray, Ca, Nov. 2, 1993.

P. M. Solomon and D. Frank, "The Case for Reversible Computation", Int'l Workshop on Low Power Design 94, Napa, Ca., pp. 93–98.

L. J. Svensson and J. G. Koller, "Adiabatic charging without inductors", Int'l Workshop on Low Power Design 94, Napa, Calif. pp. 159–164.

S. G. Younis et al., "Asymptotically zero Energy Split–Level Charge . . . ", Int'l Workshop on Low Power Design 94, Napa, Ca. pp. 177–182.

W. C. Athas et al. "A Framework for Practical Low–Power Digital . . . " Int'. Workshop on Low Power Design 94, Napa, Calif. pp. 189–194.

Athas et al. "Low Power Digital Systems Based on Adiabatic . . . ", IEEE Trans. on VLSI Systems, vol. 2, Dec. 1994, p. 398.

John S. Denker, "A Review of Adiabatic Computing", IEEE Sym. on Low Power Electronics, San Diego, Ca. Oct. 10–12, 1994, pp. 94–97.

Thad Gabara, "Pulsed Power Supply CMOS—PPS CMOS", IEEE Sym. on Low Low Power Electronics, San Diego, Ca. Oct. 10–12, 1994, pp. 98–99.

L. J. Svensson et al., "Driving a capacitive load without dissipating $fCV^2$", IEEE Sym. on Low Power Electronics, San Diego, Ca. Oct. 10–12, 1994, pp. 100–101.

(List continued on next page.)

*Primary Examiner*—David C. Nelms
*Assistant Examiner*—Son Mai
*Attorney, Agent, or Firm*—Robert M. Trepp

[57] ABSTRACT

A semiconductor memory is described incorporating an energy conserving cyclic power source for charging and discharging the bit line with a minimum voltage across the switches. The invention overcomes the problem of power dissipation in a semiconductor memory due to charging and discharging capacitances to a voltage supply or to ground. The cyclic power supply produces a slowly varying waveform to drive the bit lines or other lines in a memory array such as a dynamic RAM in a manner so that the energy stored on those lines or in the cyclic power source is recovered at the end of the cycle.

49 Claims, 15 Drawing Sheets

OTHER PUBLICATIONS

T. Kawahara et al. "A Charge Recycle Refresh for Gb–scale DRAMs . . ." 1993 Sym. on VLSI Circuits, Digest of Tech. Papers, Kyoto, Japan.

J. S. Hall, "An Electroid Switching Model for Reversible . . .", IEEE, Workshop on Phys. and Comp., PhysComp 92, Oct. 2, 1992, pp. 237–250.

R. C. Merkle, "Reversible electronic logic using switches", Nanotechnology 4 (1993) pp. 21–40.

C. H. Bennett, "Notes on the history of reversible computation", IBM J. Res. Develop. vol. 32, No. 1 Jan. 1988, pp. 16–23.

C. L. Seitz et al., "Hot–Clock nMOS", 1985 Chapel Hill Conf. on VLSI, Conf. Sci. Press, pp. 1–17.

C. Lutz et al. "Design of the Mosaic Element", 1984 Conf. on Advanced Research in VLSI, M.I.T., Jan. 23, 1984, pp. 1–10.

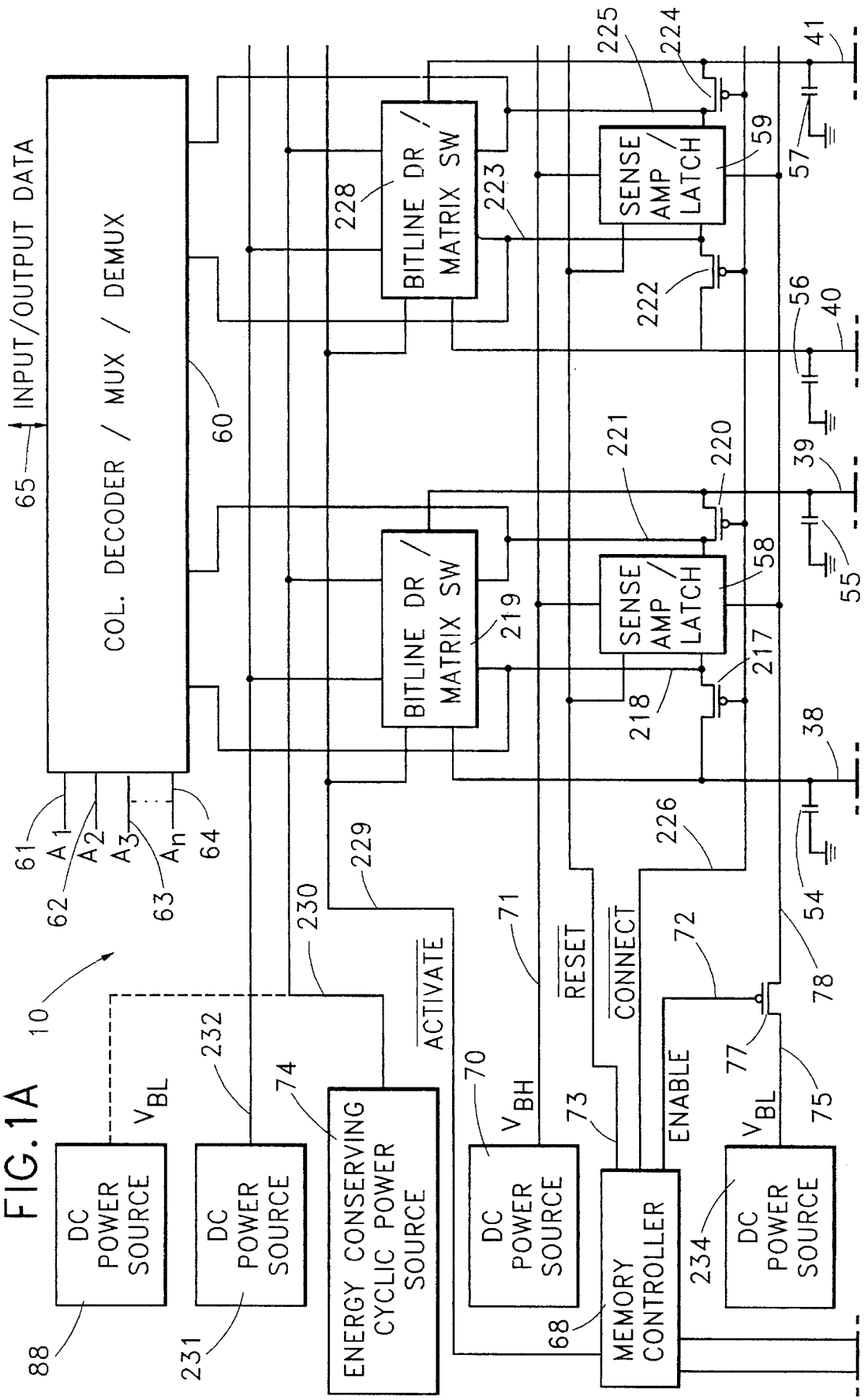

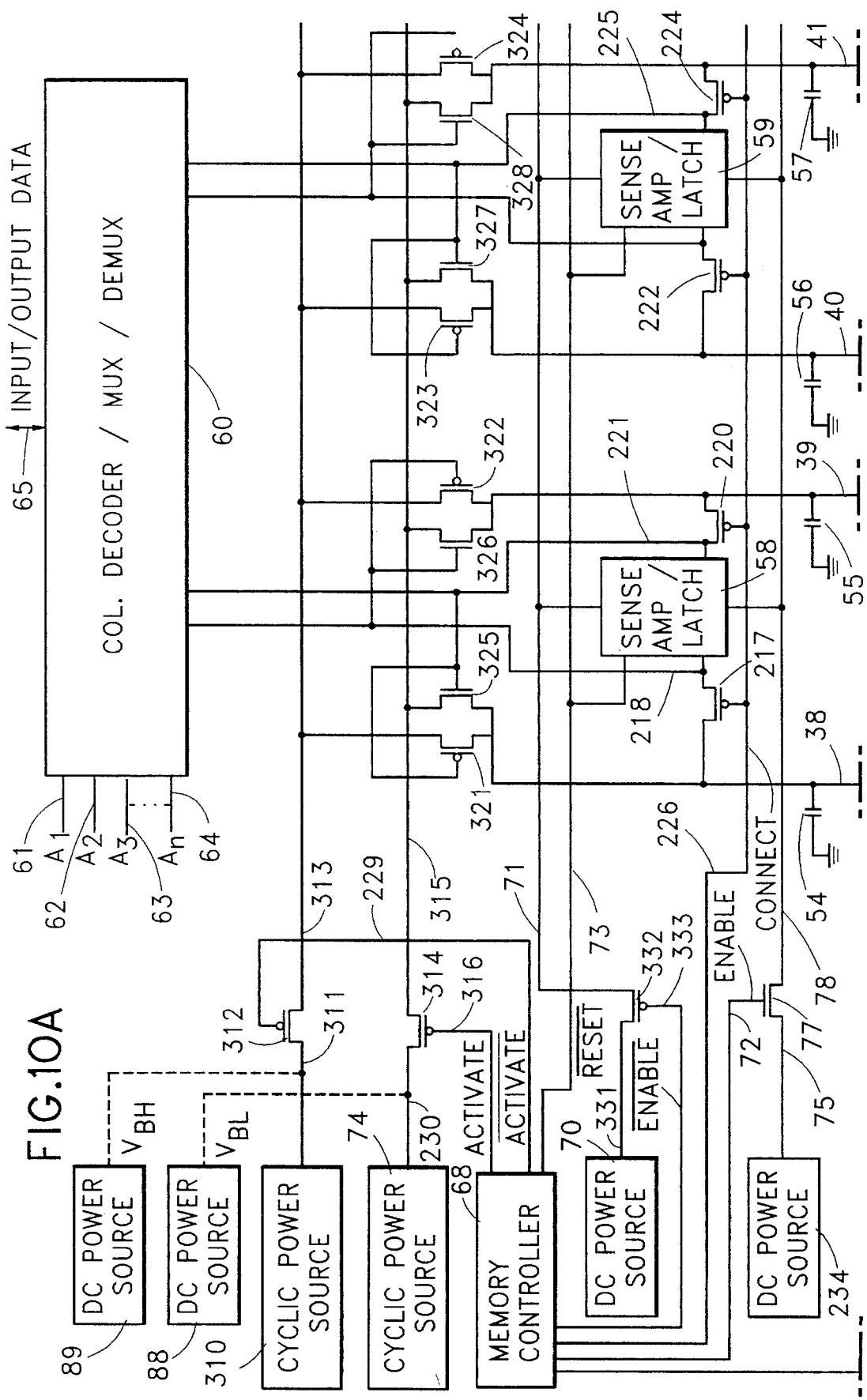

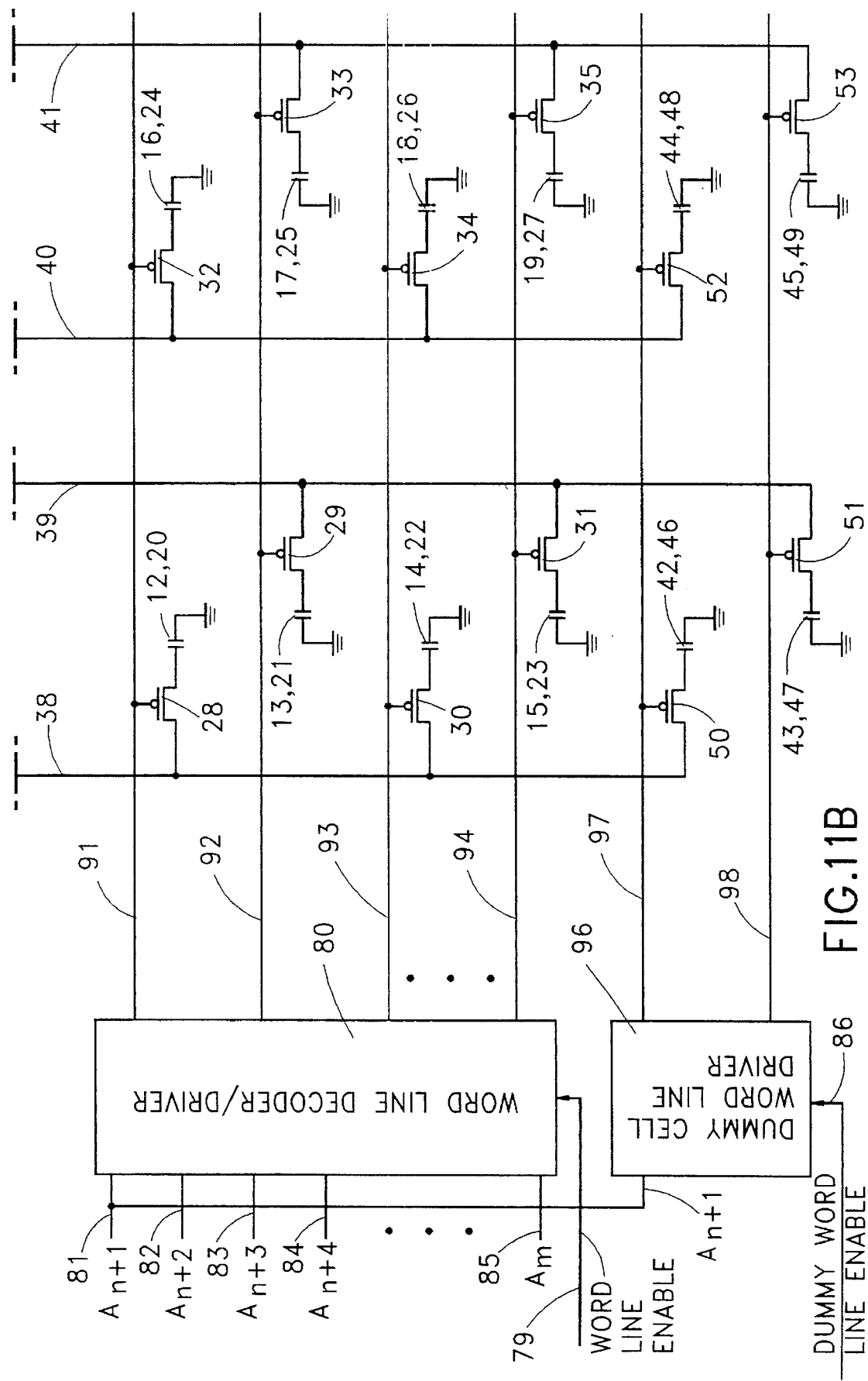

5,526,319

MEMORY WITH ADIABATICALLY SWITCHED BIT LINES

FIELD OF THE INVENTION

This invention relates to semiconductor memories and more particularly to adiabatically switched bit lines during read, write and refresh cycles of a dynamic random access memory (DRAM).

BACKGROUND OF THE INVENTION

Dynamic random access memories (DRAMs) dissipate a great deal of energy in the process of charging and discharging the bit lines of the semiconductor memory arrays. This charging and discharging is necessary for the operation of these circuits, but the dissipation of the associated energy causes a drain on the energy supply and increases the thermal energy that must be removed from the semiconductor chip. In battery powered applications, this shortens the time between necessary recharging of the battery. Also, large systems need very large banks of batteries to hold the information in a DRAM in the event of a power failure, or to allow the information to be written into non-volatile storage such as magnetic storage.

A technique for lowering power consumption in computing has been described as adiabatic switching. In adiabatic switching charging and discharging is carried out over longer time periods than the RC time constant of the node being charged so that low voltage drops occur across switches carrying charging current. In a publication by J. G. Koller et al. entitled "Adiabatic Switching, Low Energy Computing and the Physics of Storing and Erasing Information", Workshop on Phys. and Comp. "Phys. Comp. 92", IEEE p. 267 Oct. 2, 1992, an adiabatic AND gate and power supply is shown in FIG. 3 and an Adiabatic latch circuit is shown in FIG. 4.

The application of adiabatic switching and energy recovery to digital CMOS logic to reduce dynamic power dissipation has been described in a publication by W. C. Athas et al. entitled "An Energy-Efficient CMOS Line Driver Using Adiabatic Switching", University of Southern California, Information Sciences Institute, Marina del Ray, Calif. dated Nov. 2, 1993. In the paper, an adiabatic power supply is described consisting of a capacitor, switch and inductor coupled in series for flowing charge through an adiabatic line driver chip onto the load capacitances and back again.

With adiabatic switching, the energy dissipated will be reduced compared to conventional switching with the circuit speed also being reduced to allow circuit nodes to charge at slower rates than the RC time constant of the circuit nodes. In the above publication by W. C. Athas et al. a factor of 6.3 increase in energy efficiency at 1 MHz was obtained.

SUMMARY OF THE INVENTION

In accordance with the present invention, a semiconductor memory and method for operating the memory is described comprising a plurality of memory cells arranged in columns and rows, a plurality of word lines, each word line coupled to a respective row of memory cells, one or more bit lines, each bit line coupled to a respective column of memory cells, one or more sense amplifiers, each sense amplifier coupled to a respective bit line for sensing data on the bit line at times when a memory cell in one of the rows is selected by a respective word line, a first energy storage network including one or more capacitors or inductors for providing a voltage-current waveform to the bit line for writing or rewriting data into one or more memory cells and a switch for coupling the first energy storage network to one or more bit lines. The operation of the memory for writing or rewriting data may be such that the energy associated with charging and discharging the bit line capacitances is substantially recovered by the energy storage network, rather than being dissipated.

The invention further provides a circuit for charging and discharging a signal line, for example, a bit line in a semiconductor memory comprising a first energy storage network for providing a voltage-current waveform to the signal line, a first switch for coupling the signal line to the first energy storage network, the first energy storage network operable at times it is coupled to the signal line to provide a cycle of current through the switch whereby the capacitance of the signal line is charged and discharged with a minimum of voltage across the switch whereby the power dissipation in the switch and in the first energy storage network is minimized i.e. the energy is recovered.

The invention further provides circuitry to use adiabatic charging principles to recover most of the signal line charging energy i.e. such as the bit line charging energy instead of discharging energy to ground, thus avoiding most of the power dissipation occurring in rewriting or refreshing present DRAMs.

The invention further provides an energy conserving cyclic power source as a driver for a signal line such as a bit line.

The invention further provides a first and second energy conserving cyclic power source coupled through switches to a bit line whereby the bit line may be charged to a first or second voltage depending on the power source coupled for writing or rewriting data, a "1" or "0", into a selected memory cell coupled to the bit line.

The invention further provides a first and second dc power source coupled through switches to a bit line whereby the bit line may be charged to a first or second voltage depending on the dc power source coupled for writing or rewriting data, a "1" or "0", into a selected memory cell coupled to the bit line.

The invention further provides the step of sensing data with a sense amplifier coupled to a bit line having a selected memory cell coupled to the bit line at first times and recharging said bit line for writing or rewriting data into the memory cell by the step of coupling an energy conserving cyclic power source or a dc power source to the bit line.

The invention further provides an energy conserving cyclic power source coupled through a conventional sense amplifier-driver to a bit line to be written or rewritten with data.

The invention further provides circuitry for coupling the bit line through a first switch at first times to a sense amplifier for sensing data and through a second switch at second times to an energy conserving cyclic power source for recharging the bit line for rewriting data into a selected memory cell.

The invention further provides coupling one side of a folded bit line to an energy conserving cyclic power source for writing or rewriting data into a selected memory cell. The folded bit line may have one side coupled to memory cells in even rows and to a first input terminal of a sense amplifier and the other side of the folded bit line coupled to memory cells in odd rows and to a second input terminal of a sense amplifier.

BRIEF DESCRIPTION OF THE DRAWINGS

These and other features, objects, and advantages of the present invention will become apparent upon consideration of the following detailed description of the invention when read in conjunction with the drawings in which:

FIGS. 1A and 1B is a first embodiment of the invention.

FIGS. 10A and 10B is a second embodiment of the invention.

FIGS. 11A and 11B is a third embodiment of the invention.

DESCRIPTION OF THE PREFERRED EMBODIMENT

Figure 1B:
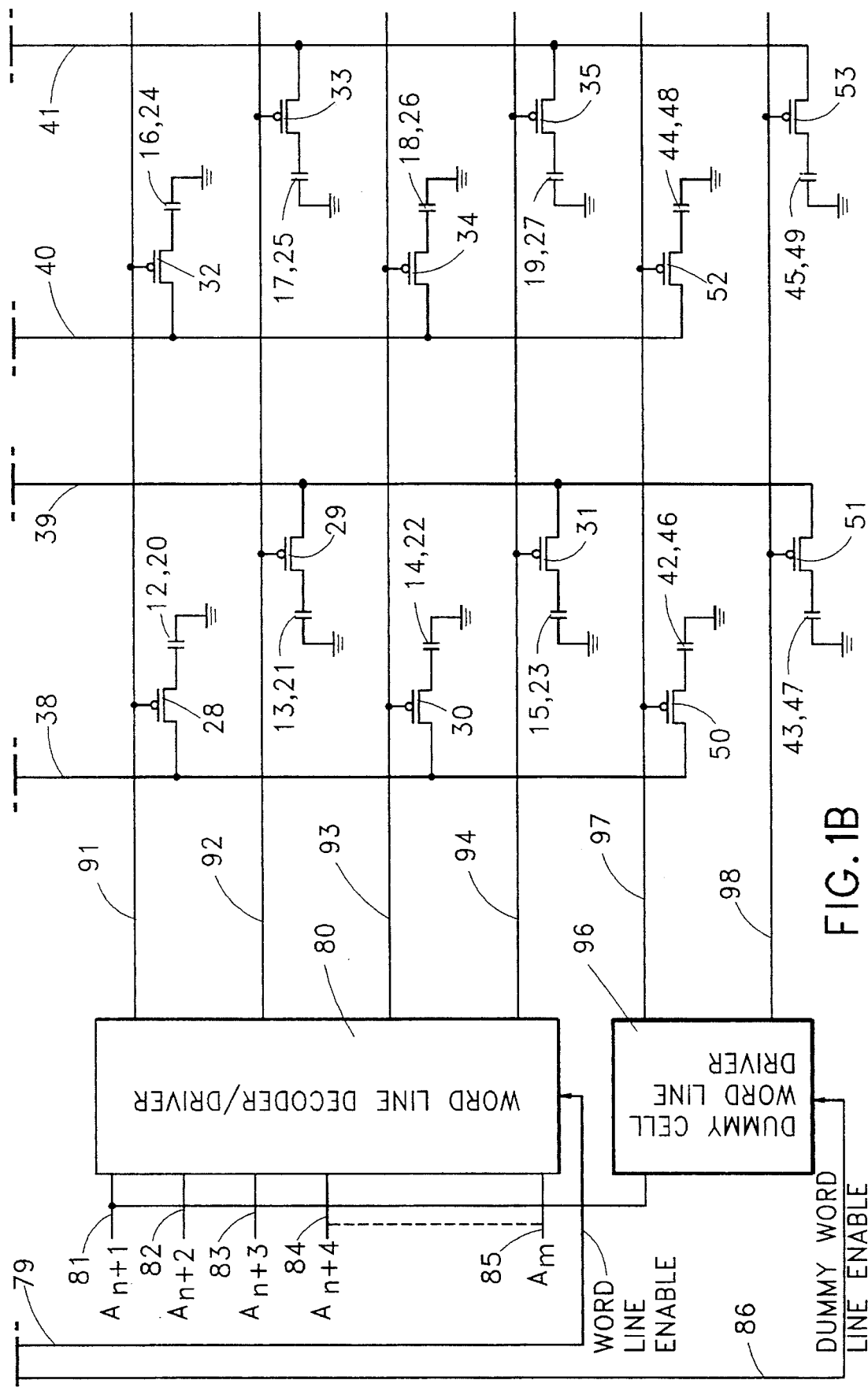

Referring to the drawing, FIGS. 1A and 1B shows semiconductor memory for storing, refreshing and retrieving data. Semiconductor memory 10 may be a dynamic random access memory (DRAM) where each memory cell 12–19 stores a charge on a capacitor indicative of the data. Each memory cell 12–19 may have a respective capacitor 20–27 having one side coupled to ground. The other side of capacitors 20–27 are coupled to the drain of respective field effect transistors 28–35. Field effect transistors 28–35 may be metal oxide silicon p-channel transistors or n-channel transistors. P-channel transistors are shown in FIG. 1A and 1B. The sources of transistors 28 and 30 are coupled to bit line 38. The sources of transistors 29 and 31 are coupled to bit line 39. The sources of transistors 32 and 34 are coupled to bit line 40. The sources of transistors 33 and 35 are coupled to bit line 41. Bit lines 38 through 41 are also coupled to respective dummy memory cells 42–45. Dummy memory cells 42–45 include a respective capacitor 46–49 having one side coupled to ground. The other side of capacitors 46–49 are coupled to the drain of respective field effect transistors 50–53. The sources of transistors 50–53 are coupled to respective bit lines 38–41. The source and drain of a field effect transistor (FET) are interchangeable.

In FIGS. 1A and 1B two memory cells and a dummy memory cell are shown coupled to each bit line 38–41. Typically, in a semiconductor memory of present designs, 128 or 256 memory cells would be coupled to a bit line in addition to a dummy memory cell. Each of these bit lines has parasitic capacitance to the substrate or n-well and to the word lines. This capacitance is represented in FIGS. 1A and 1B by capacitors 54–57 connected to bit lines 38–41 respectively. For simplicity the other side of parasitic capacitors 54–57 is shown connected to ground potential. With 256 memory cells coupled to a bit line the capacitance of the bit line would be in a range from 250 to 500 femtofarads (fF).

Bit line 38 is coupled through a switch, transistor 217, over lead 218 to a data input of sense amp/latch 58. Bit line 38 is also coupled directly to bit line driver/matrix switch 219. Bit line 39 is coupled through a switch, transistor 220, over lead 221 to a data input of sense amp/latch 58. Bit line 39 is also coupled directly to bit line driver/matrix switch 219. Sense amp/latch 58 may be coupled to and then isolated from bit lines 38 and 39 at selected times by turning on and off transistors 217 and 220. Leads 218 and 221 are coupled to respective terminals of bit line driver/matrix switch 219 and of column decoder/multiplexer/demultiplexer 60.

Bit line 40 is coupled through transistor 222 and over lead 223 to a data input of sense amp/latch 59. Bit line 41 is coupled through transistor 224 and over lead 225 to a data input of sense amp/latch 59. Bit lines 40 and 41 are also connected to respective terminals of bit line Driver/Matrix Switch 228. The gates of transistors 217, 220, 222 and 224 are coupled over lead 226 to signal $\overline{\text{CONNECT}}$. Sense amp/latch 59 may be coupled to and then isolated from bit lines 40 and 41 at selected times by turning on and off transistors 222 and 224 by way of signal $\overline{\text{CONNECT}}$. Leads 223 and 225 are coupled to respective terminals of bit line driver/matrix switch 228 and of column decoder/multiplexer/demultiplexer 60.

Address signals $A_1, A_2, A_3, \ldots A_n$ are coupled to column decoder/multiplexer/demultiplexer 60 on leads 61, 62, 63, ... 64, respectively. Input and output data are coupled over lead 65 to/from column decoder/multiplexer/demultiplexer 60. The column decoder/multiplexer/demultiplexer functions in response to address signals $A_1$ to $A_n$ to select one column in semiconductor memory 10. The number of columns in a semiconductor memory of present designs may range from 128 to 512 columns.

A DC power source 70 provides a constant DC voltage of $V_{BH}$, which may for example be 3.3 V over lead 71 to sense amplifier and latches 58 and 59. An ENABLE signal from memory controller 68 is coupled over lead 72 to the gate of FET 77. A $\overline{\text{RESET}}$ signal from memory controller 68 is coupled over lead 73 to sense amplifier and latches 58 and 59.

DC power source 234 is coupled over lead 75 to the source of FET 77. The drain of transistor 77 is coupled over lead 78 to sense amplifier and latches 58 and 59. DC power source 234 functions to provide a voltage, which may be at or near ground potential, to activate the sense amplifier/latches 58 and 59 to sense the data from the bit lines on leads 218, 221, 223 and 225. In this description the voltage level of power source 234 will be considered to be the same as the lowest bit line level $V_{BL}$ to allow ease of comparison. The ENABLE signal on lead 72 switches FET 77 on at the appropriate time for sensing data on leads 218 and 221 and on leads 223 and 225. Semiconductor memory 10 may be a portion of a larger memory system. Other Enable signals may select other semiconductor memories 10 in the memory system in the same manner to sense data at appropriate times.

Signal WORD LINE ENABLE from memory controller 68 is coupled over lead 79 to an input of word line decoder/driver 80. Signal DUMMY WORD LINE ENABLE from memory controller 68 is coupled over lead 86 to an input of dummy cell word line driver 96. Address signals $A_{n+1}$ through $A_m$ are coupled over leads 81–85 to respective inputs of word line decoder/driver 80.

word line decoder/driver 80 functions to select one of leads 91–94 in response to the address signals on leads 81–85 to provide a waveform for accessing memory cells coupled to the selected word line. Word line 91 is coupled to the gates of transistors 28 and 32 of respective memory cells 12 and 16. Word line 92 is coupled to the gates of transistors 29 and 33 of respective memory cells 13 and 17. Word line 93 is coupled to the gates of transistors 30 and 34 of respective memory cells 14 and 18. Word line 94 is coupled to the gates of transistors 31 and 35 of respective memory cells 15 and 19.

The least significant address bit signal $A_{n+1}$ is coupled over lead 81 to an input of dummy cell word line driver 96. Dummy cell word line driver 96 selects one of word lines 97 and 98 in response to the signals on leads 81 and 86. Word line 97 is coupled to dummy memory cells 42 and 44 which are coupled to bit lines 38 and 40 respectively. Word line 98 is coupled to dummy memory cells 43 and 45 which are coupled to bit lines 39 and 41 respectively. Dummy cell word line driver 96 functions to select the dummy cell connected to the bit line that is not the bit line having a selected memory cell by way of the selected word line by Word Line Decoder/Driver 80. Word line 97 is coupled to the gates of transistors 50 and 52 corresponding to dummy memory cells 42 and 44. Word line 98 is coupled to the gates of transistors 51 and 53 corresponding to respective memory cells 43 and 45.

A control signal $\overline{\text{ACTIVATE}}$ from memory controller 68 is coupled over lead 229 to a control input of bit line driver/matrix switches 219 and 228. Energy conserving cyclic power source 74 is coupled over lead 230 to bit line driver/matrix switches 219 and 228. DC power source 231 is coupled over lead 232 to bit line driver/matrix switches 219 and 228.

Figure 2:
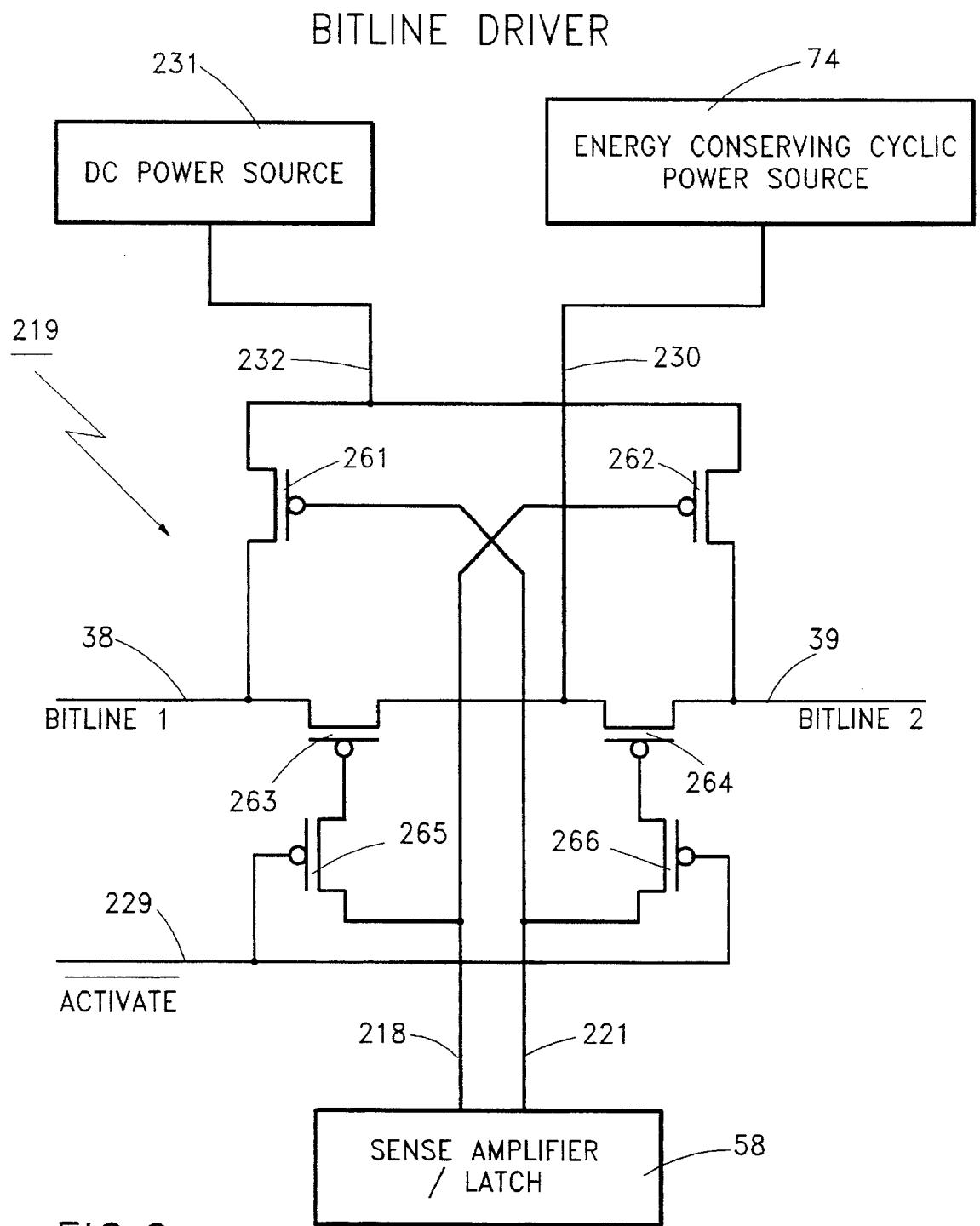
FIG. 2 is a schematic circuit of a bit line driver.

FIG. 2 is a schematic circuit of a bit line driver 219 suitable for use in FIGS. 1A and 1B. In FIG. 2 like reference numbers are used for functions corresponding to the apparatus of FIGS. 1A and 1B. Lead 232 is coupled to DC power source 231 and to the drains of transistors 261 and 262. The source of transistor 261 is coupled to lead 38, a bit line, and to the source of transistor 263. The source of transistor 262 is coupled to lead 39, a bit line, and to the source of transistor 264. The drains of transistors 263 and 264 are coupled to lead 230 and to energy conserving cyclic power source 74. The gate of transistor 261 is coupled over lead 221 to the drain of transistor 266 and to sense amplifier/latch 58. The gate of transistor 262 is coupled over lead 218 to the drain of transistor 265 and to sense amplifier/latch 58. The gate of transistor 263 is coupled to the source of transistor 265. The gate of transistor 264 is coupled to the source of transistor 266. Lead 229 is coupled to the gates of transistors 265 and 266 and to control signal $\overline{\text{ACTIVATE}}$. As shown in FIG. 2 transistors 261 through 266 are p-channel MOS transistors.

Figure 3:
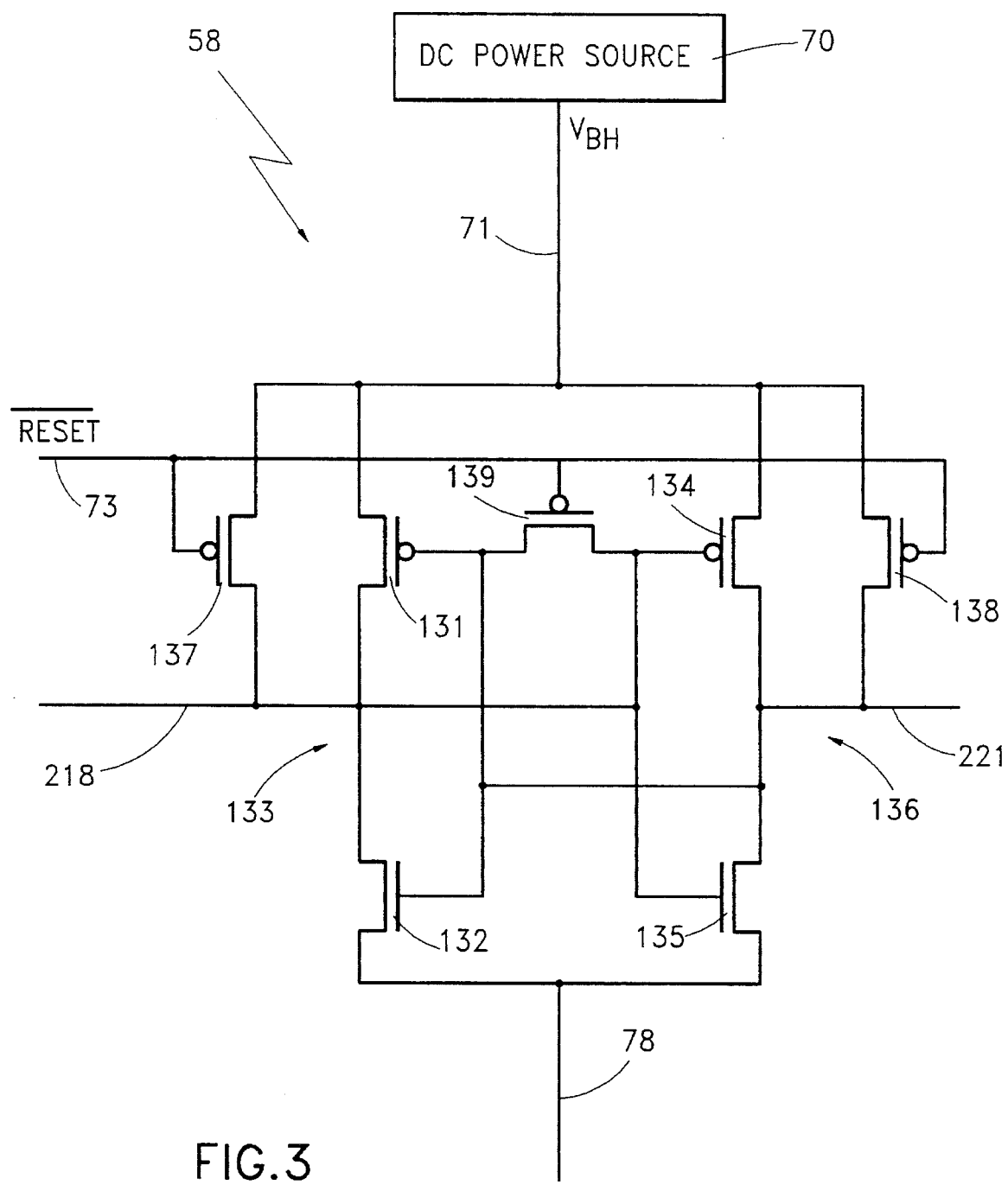
FIG. 3 is a schematic circuit of a sense amplifier and latch.

FIG. 3 is a schematic circuit of one embodiment of sense amplifier and latch 58. In FIG. 3 like references are used for functions corresponding to the apparatus of FIGS. 1A and 1B. Transistors 131 and 132, coupled in series, form inverter 133 and transistors 134 and 135, coupled in series, form inverter 136. The drains of transistors 131 and 132 are coupled to lead 218 and to the gates of transistors 134 and 135. The drains of transistors 134 and 135 are coupled to lead 221 and to the gates of transistors 131 and 132 to form a latch. Transistors 131 and 134 may be p-channel transistors having their source electrodes coupled to lead 71. The sources of transistors 132 and 135 are coupled to lead 78. The amplifier and latch 58 may be reset by way of transistors 137–139 which may be p-channel transistors having their gate electrodes coupled to lead 73 which in turn is coupled to signal $\overline{\text{RESET}}$. The sources of transistors 137 and 138 are coupled to lead 71 and the drain of transistor 137 is coupled to lead 218. The drain of transistor 138 is coupled to lead 221. One side of transistor 139 either the drain or source is coupled to lead 221 and the other side is coupled to lead 218. At times signal $\overline{\text{RESET}}$ is low or a logic zero, transistors 137–139 will be conducting pulling all voltage nodes of the latch leads 218 and 221 to the same voltage and to the voltage on lead 71. When signal RESET goes high or to a logic 1 transistors 137 to 139 become non-conducting. When the memory cell and dummy cell are accessed, a small signal voltage is developed between leads 218 and 221. When a low voltage such as $V_{BL}$ is applied to lead 78, the latch formed by inverters 133 and 136 is set when one of transistors 132 and 135 becomes more conducting than the other due to the voltage on its gate electrode.

If transistor 132 is conducting then the current passing through transistor 132 will pull lead 218 and the gate of transistor 134 low which will cause transistor 134 to be conducting pulling lead 221 high via lead 71. If transistor 135 is conducting, the current passing through transistor 135 will cause lead 221 and the gate electrode of transistor 131 to go low causing transistor 131 to be conducting pulling lead 218 high via lead 71.

Figure 4:
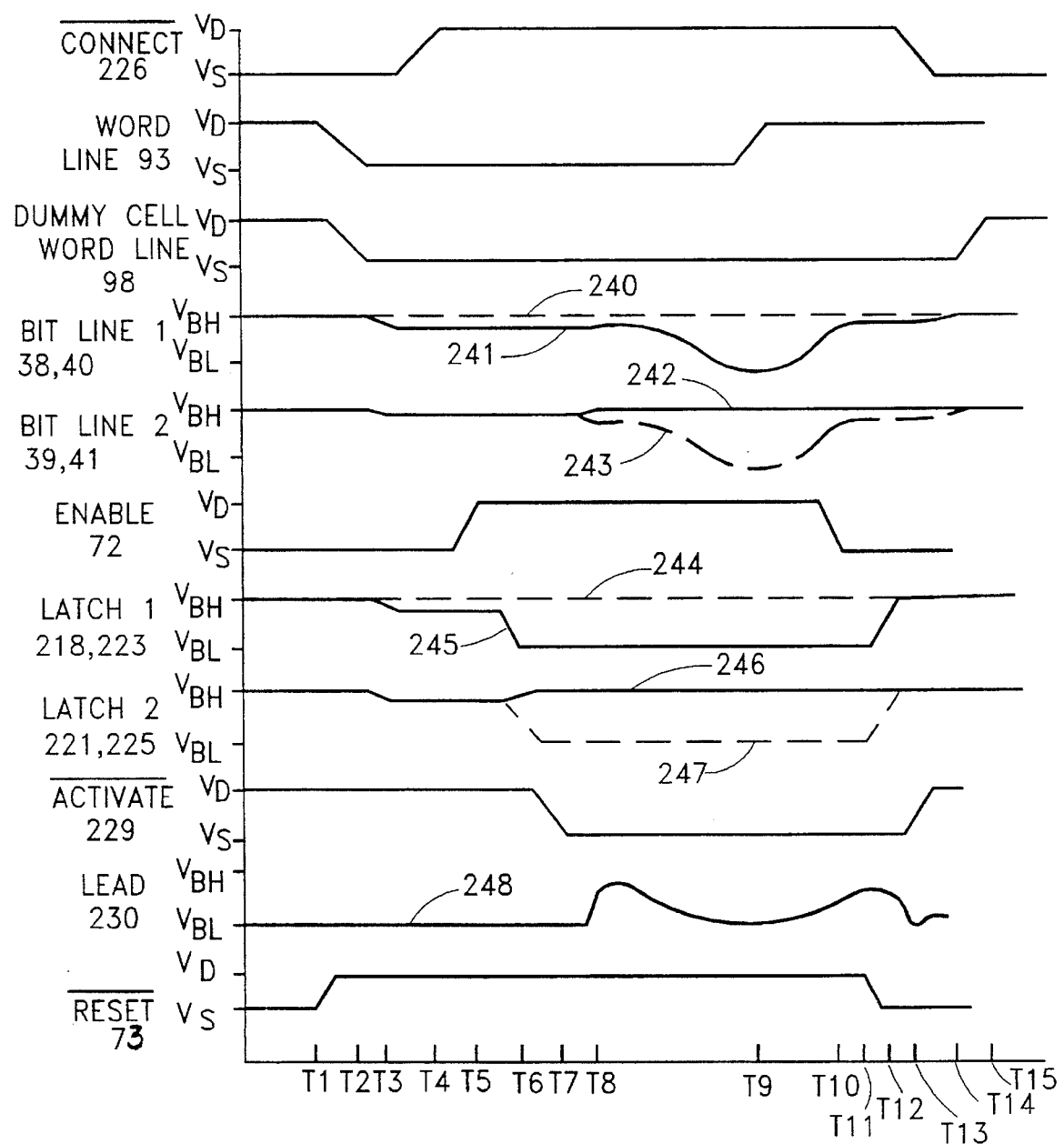
FIG. 4 shows typical waveforms for operation of the first embodiment shown in FIG. 1.

FIG. 4 shows typical waveforms for a read or refresh cycle of the memory system 10 in FIG. 1. The cycle begins at time T1. Before time T1 the word lines 91–94, 97, 98 are all high, deactivating all memory and dummy cells. The bit lines 38–41 and the sense amplifier/latch inputs 218, 221, 223, 225 are all precharged high. The $\overline{\text{CONNECT}}$ signal is low at time T1, causing FETs 217, 220, 222, and 224 to be turned on, thus connecting the bit lines to their respective sense amplifier inputs: 38 to 218, 39 to 221, 40 to 223, and 41 to 225. At time T1 the RESET signal is retracted allowing sense amplifier inputs to be isolated or float. At time T2 one of the word lines, 93 for purposes of illustration, and its associated dummy cell word line 98 are enabled and drop to a low level, turning on FETs 30, 34, 51, and 53 in memory cells 14 and 18, and in dummy cells 43, and 45 respectively. When these FETs are turned on, the charge in cell storage capacitors 22, 47, 26, and 49 is transferred onto bit lines 38–41 respectively, resulting in small voltage signals on the bit lines at time T3. Since the $\overline{\text{CONNECT}}$ signal is low, these small voltages also appear on the inputs 218, 221, 223, 225 to the sense amplifier/latches 58, 59. If the data stored in cell 14 or 18 is represented by a high voltage on the respective storage capacitor, then waveforms 240 and 244 result for the bit line and sense line coupled to that cell, while if the data is represented by a low voltage, then waveforms 241 and 245 result for the bit line and sense line coupled to that cell, since the capacitors in the dummy cells are only charged to Vdd/2 (using circuitry not shown), the signals on lines 39, 41,221 and 225 are only half as large as that of waveform 241.

At time T4 the $\overline{\text{CONNECT}}$ signal goes high, turning off transistors 217,220,222, and 224, and disconnecting the bit lines from the sense amplifier/latch inputs. At time T5 the ENABLE signal is applied turning on FET 77, and connecting DC power source 234, which is at $V_{BL}$ which may be zero volts, to the sense amplifier/latches. This causes the data from the sense lines 218, 221, 223, 225 to be sensed and latched at time T6, in essentially the same manner as would occur in conventional memory systems. The bit lines do not change potential at this time, however, because they have been disconnected from the sense amplifiers/latches. The energy dissipation associated with this sensing is $C_s V^2/2$, where $C_s$ is the capacitance of a sense amplifier/latch input, which may be much less than the capacitance of an entire bit line.

At time T7 the $\overline{\text{ACTIVATE}}$ signal is applied, turning on FETs 265 and 266 in bit line driver/matrix switches 219 and 228. These transistors pass the outputs of the latches on to FETs 263 and 264 shown in FIG. 2, turning on one of the two, since one side of the latch is at a high potential and the other side is at a low potential, depending on the data that has been sensed. When one of FETs 263 and 264 turns on, it connects the cyclic power supply 74 to the bit line that must be cycled low. If, for example, sense line 218 from sense amplifier/latch 58 is low, then FET 263 connects the cyclic power supply 74 to bit line 38, while FET 262 turns on to hold bit line 39 at the voltage provided by DC supply 231, which is $V_{BH}$ in this case. Similarly, if sense line 221 from sense amplifier/latch 58 is low, then FET 264 connects the cyclic power supply 74 to bit line 39, while FET 261 turns on to hold bit line 38 at the voltage provided by DC supply 231. The turning on of FET 263 or 264 may cause the cyclic power supply 74 to begin its cycle as indicated at time T8. For this embodiment the power source of FIG. 8 has been assumed, but any type of energy recovering cyclic power source could be used. As indicated in waveform 248, the voltage on lead 230 quickly rises up to the precharge level of the bit lines, and then slowly ramps back toward $V_{BL}$, adiabatically discharging the bit lines that have been connected to it (38 or 39, and 40 or 41) as shown in waveforms 241 and 243. This process dissipates very little energy because very little voltage develops across any of the transistors.

At time T9 the cyclic power supply reaches its minimum, and the word line 93 is returned to a high level, turning off the transistors in memory cells 14, 18, thus storing the voltage level on line 38 or 40 at that time, which represents the correct data to be rewritten in the capacitors of the cells. If this is a read cycle, column decoder/multiplexer/demultiplexer 60 can be activated at any time between T8 and T10 to obtain the desired data from latches 58 and 59. After time T9 the cyclic power supply 74 slowly ramps back up to $V_{BH}$, adiabatically charging the capacitance of the bit lines to which it is connected, dissipating very little energy. Energy storage network or cyclic power supply 74 may provide a sine wave voltage waveform. At time T10 the cyclic power supply reaches its maximum value, and the cycle is stopped. First, at time T10, the ENABLE signal is removed, allowing sense amplifier/latch outputs 218, 221, 223, 225 to float. Next at time T11 the $\overline{\text{RESET}}$ signal goes low. As shown at time T12, this causes the sense amplifier/latch outputs to be pulled up to the level provided by DC power source 70, which is $V_{BH}$. This step dissipates an energy of about $C_sV^2/2$, and also results in FETs 263 and 264 in matrix switches 219 and 228 being turned off.

Figure 8:
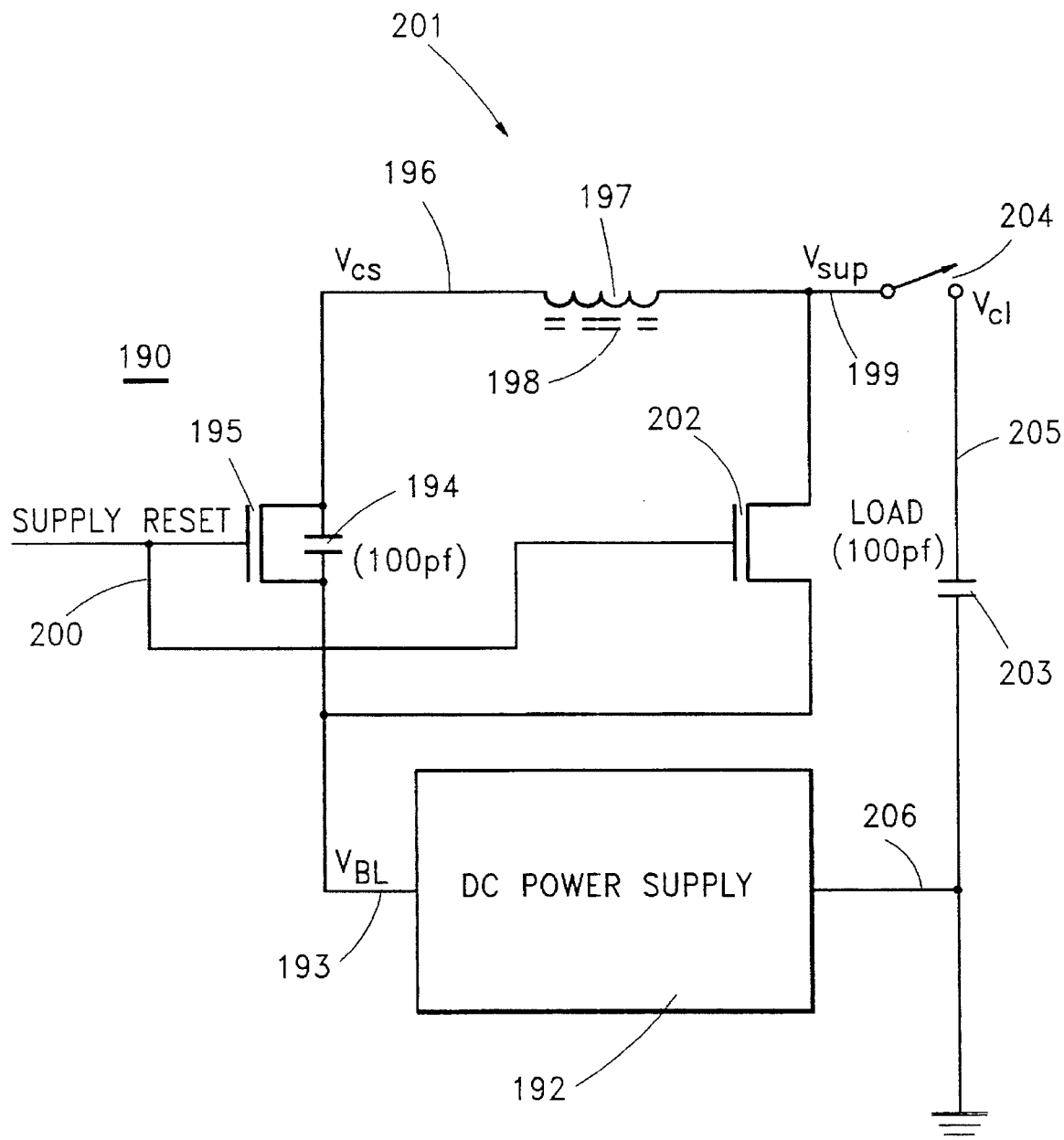
FIG. 8 is a schematic circuit of a third embodiment of an energy conserving cyclic power source.

At time T13, in response to FETs 263 and 264 being turned off and, for example, to the application of SUPPLY RESET on lead 200 in FIG. 8, the energy conserving cyclic power source 74 returns to its quiescent $V_{BL}$ level. At time T14 the ACTIVATE signal is removed, turning off FETs 265 and 266 in the matrix switches. Also at time T14 the CONNECT signal is reasserted. This turns on FETs 217, 220, 222, and 224 connecting the bit lines to the sense amp-latches. As shown at T15, this results in the bit lines being pulled the remainder of the way up to $V_{BH}$ via leads 218, 221, 223 and 225, if they are not already there. Word line 98 can be returned to the high level at the end of the cycle to write a high level into the cell which can then be divided by conventional means to restore the original level to capacitors in cells 43 and 45. The energy dissipation for this cycle has only been approximately $C_s (V_{BH}-V_{BL})^2$ per bit line pair, which should be compared to $C(V_{BH}-V_{BL})^2$ that would have been dissipated if adiabatic charging had not been used. Since $C_s$ can be less than ⅕ as much as the bit line capacitance C, the energy savings can be more than 80%.

In an alternate embodiment as shown in FIGS. 1A and 1B energy conserving cyclic power source 74 may be removed or disconnected from lead 230 and lead 230 may be connected as shown by the dotted line to power source 88 which may be a dc power source having a voltage to charge the bit line to a low voltage level $V_{BL}$ corresponding to a data bit of zero, shown in FIG. 4. Use of dc power source 88 may save some energy if the bit line voltage swing from $V_{BH}$ to $V_{BL}$ is smaller than previously necessary but would not save as much power as the use of an energy conserving cyclic power source 74 would save.

Figure 5:
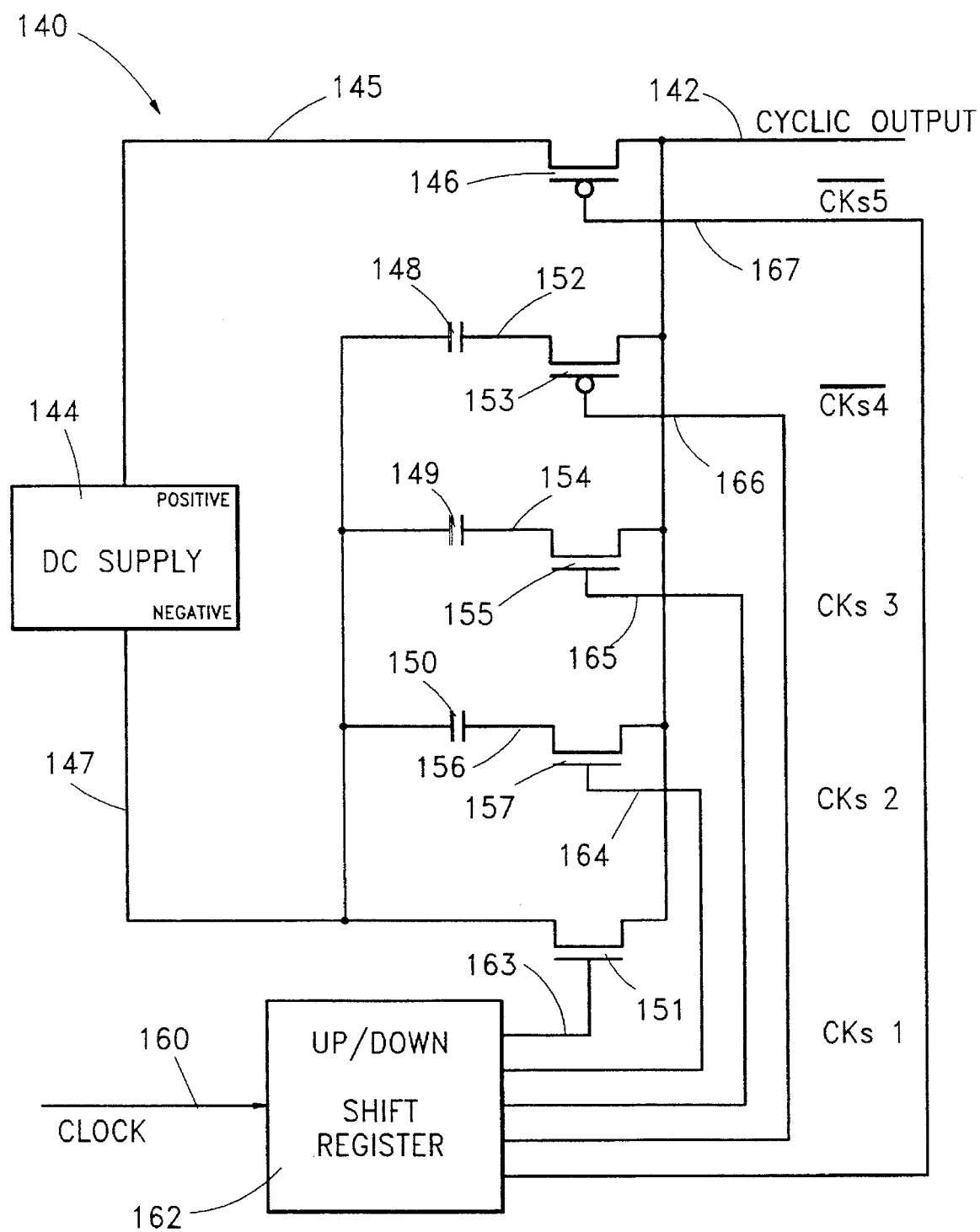
FIG. 5 is a schematic circuit of a first embodiment of an energy conserving cyclic power source.

FIG. 5 is a schematic circuit of a prior art cyclic power source 140 suitable for use as energy conserving cyclic power source 74 shown in FIGS. 1A and 1B. Cyclic power supply 140 functions to provide a voltage on lead 142 which may swing from high to low and then back to high. While the supply is swinging from high to low, it stores up current from the load, and while it is swinging from low to high, it returns current to the load. DC power supply 144 is coupled over lead 145 through transistor 146 to lead 142. Lead 145 may be coupled to the positive side of DC supply 144. The negative of DC power supply 144 is coupled over lead 147 to one side of capacitors 148 through 150 and to the source of transistor 151. The other side of capacitor 148 is coupled over lead 152 to the drain of transistor 153. The other side of capacitor 149 is coupled over lead 154 to the source of transistor 155. The other side of capacitor 150 is coupled over lead 156 to the source of transistor 157. The source of transistors 146 and 153 and the drain of transistors 155, 157 and 151 are coupled to lead 142. A clock signal is coupled over lead 160 to the clock input of up/down shift register 162. Up/down shift register 162 has output leads 163 through 167 which are coupled to the gates of transistors 151, 157, 155, 153 and 146 respectively.

Cyclic power supply 140 may consist of a large number of capacitors such as N capacitors which are separately and sequentially switched to the output node, lead 142 to charge a load which may be for example in the range from 100 pf to 10 nf. Each capacitor such as capacitors 148 through 150 is charged to a different voltage between zero and V, the voltage on the positive terminal of DC supply 144 which is the final output of cyclic power supply 140. If N capacitors are used, the first capacitor, capacitor 150, is charged to V/(N+1), the second capacitor, capacitor 149, is charged to 2 V/(N+1), the third capacitor, capacitor 148, is charged to 3 V/(N+1) and so forth until the N'th capacitor is charged to voltage NV/(N+1). During the charging or discharging cycle of a capacitive load such as leads 230 and 38 in FIGS. 1A and 1B, the capacitors of cyclic power supply 140 are sequentially switched to lead 142. As shown, in FIG. 6, the capacitive load is discharged from V to zero and then recharged to V.

Figure 6:
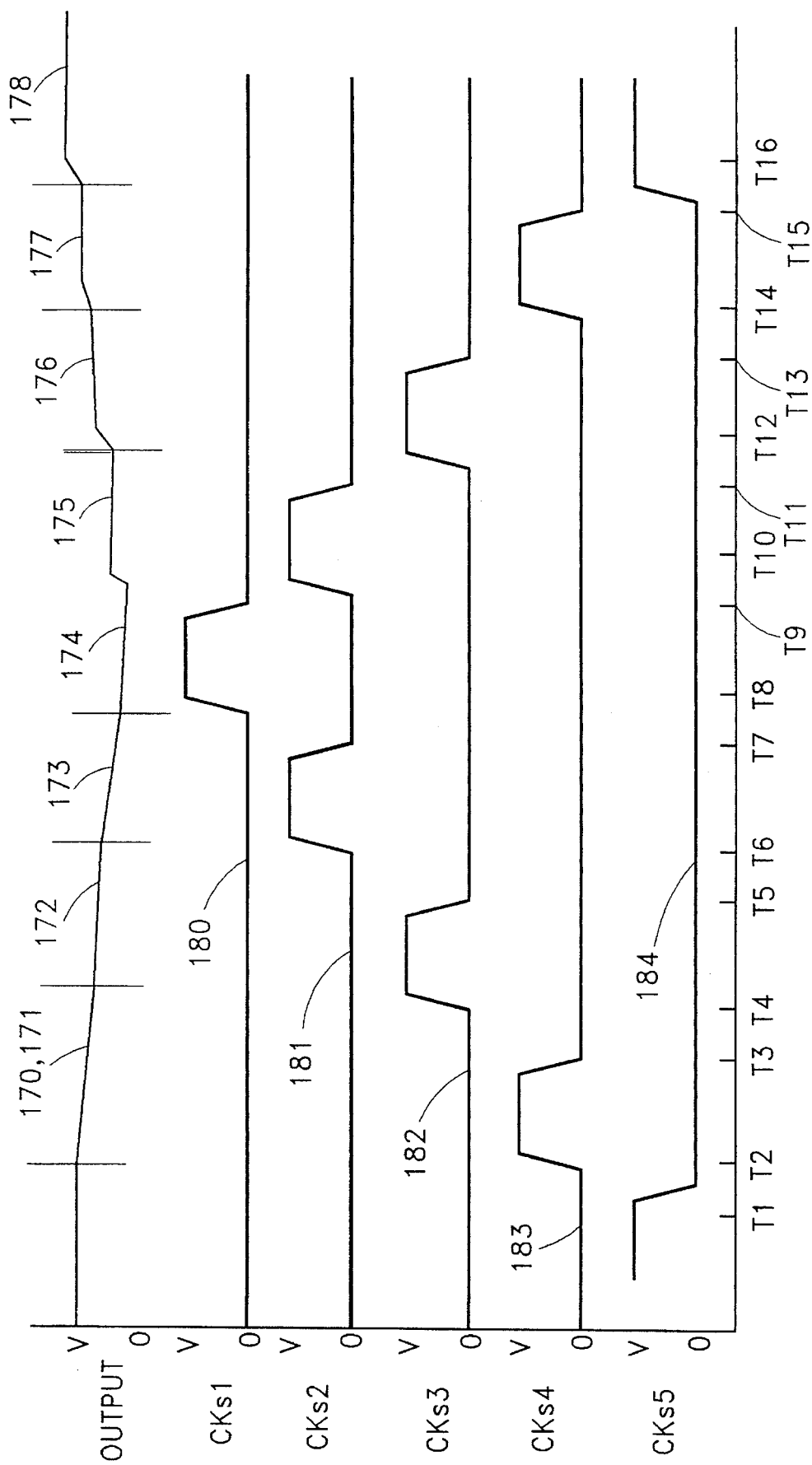
FIG. 6 shows typical waveforms for operation of the energy conserving cyclic power source shown in FIG. 5.

FIG. 6 shows typical waveforms for operation of the cyclic power supply shown in FIG. 5. In FIG. 6 the ordinate represents voltage and the abcissa represents time. At time T1 signal CKs5 goes low turning off transistor 146 thereby opening lead 145 from lead 142. At time T2, signal CKs4 goes high turning on transistor 153 coupling capacitor 148 to lead 142 which tends to discharge lead 142 as shown by curve 170. At T3, signal CKs4 goes low turning off transistor 153. At time T4, CKs3 goes high turning on transistor 155 coupling capacitor 149 to lead 142. Capacitor 149 tends to discharge lead 142 as shown by curve portion 172. At T5, signal CKs3 goes low turning off transistor 155. At T6, signal CKs2 goes high turning on transistor 157. Capacitor 150 is coupled to lead 142 which discharges lead 142 as shown by curve portion 173. At T7, signal CKs2 goes low turning off transistor 157. At T8, signal CKs1 goes high turning on transistor 151 which couples lead 147 and the negative terminal of DC supply 144 to lead 142 which fully discharges the voltage on lead 142 as shown by curve portion 174. At T9, signal CKs1 goes low turning off transistor 151. At T10, signal CKs2 goes high turning on transistor 157 coupling capacitor 150 to lead 142 which recharges lead 142 as shown by curve portion 175. At T11, signal CKs2 goes low turning off transistor 157. At T12, signal CKs3 goes high turning on transistor 155 which couples capacitor 149 to lead 142 which charges lead 142 an increment as shown by curve portion 176. At T13, signal CKs3 goes low turning off transistor 155. At T14, signal CKs4 goes high turning on transistor 153 which couples capacitor 148 to lead 142. Capacitor 148 charges up the voltage on lead 142 as shown by curve portion 177. At T15, signal CKs4 goes low turning off transistor 153. At T16, signal CKS5 goes high turning on transistor 146 which couples the positive terminal of DC supply 144 to lead 142. DC supply 144 recharges lead 142 to voltage V as shown by curve portion 178. Curve portion 175 shows lead 142 being charged from zero to V/4 volts, curve portion 176 shows lead 142 being charged from V/4 to 2 V/4. And curve portion 177 shows lead 142 charged from 2 V/4 to 3 V/4. Curve portion 178 shows lead 142 charged from 3 V/4 to V where V is the voltage across DC supply 144 and there are 4 steps and 3 capacitors used in the supply. The time during which each transistor is turned on, such as T3-T2, T5-T4, etc. must be longer than the RC time constant of the load such as lead 230 and lead 38 in FIGS. 1A and 1B, so that the charging or discharging of capacitors 148 through 150 during respective time intervals is substantially complete before the next respective capacitor is coupled to the load. Following this prescription, the energy dissipation required to charge or discharge the load capacitor can be reduced a factor of N+1 where N is the number of capacitors from what it would be in a conventional single step power supply.

The separate capacitors of the cascade power supply need not be individually precharged at the beginning. That can be accomplished by the operating circuitry at start up by simply allowing the circuits to operate a few cycles. During the set up time, a significant amount of power will be needed to provide for the initial charging of capacitors 148 through 150. In operation an external power source charges the load capacitor to a voltage V during each cycle, and the other capacitors are charged from the load. The external power supply may be DC supply 144.

Up/down shift register 162 functions to provide signals CKs1 through CKs5. Other logic circuitry or counters or shift registers may be provided to provide the clock signal CKs1 through CKs5. The time spacing between two consecutive times such as T1 to T2 may be extended indefinitely without incurring power consumption. The time of occurrence of T1 through T16 is adjusted to the cycle time desired for charging and discharging the load.

Figure 7:
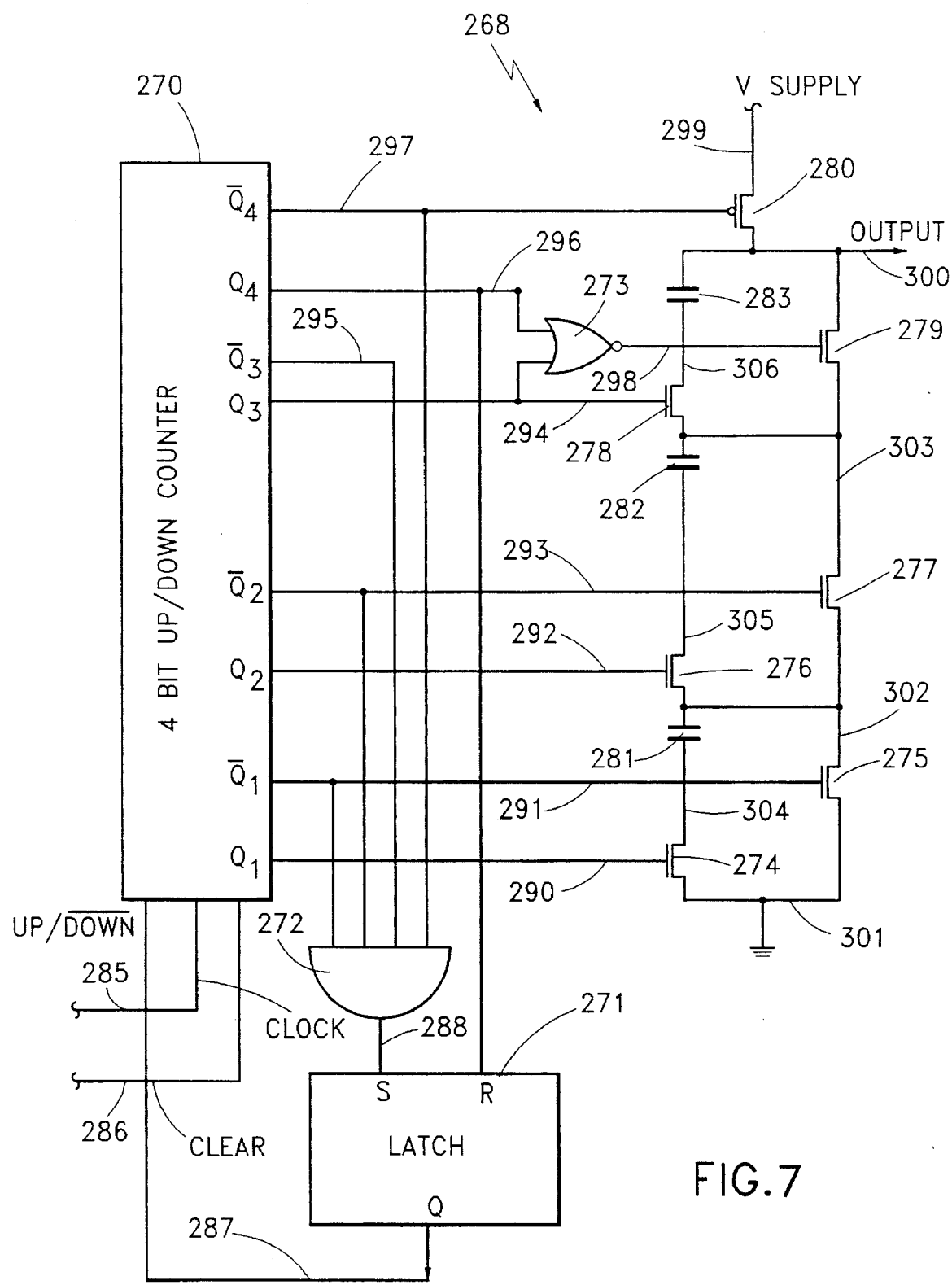
FIG. 7 is a schematic circuit of a second embodiment of an energy conserving cyclic power source.

FIG. 7 is a schematic circuit 268 of a second embodiment of an energy conserving cyclic power source. Circuit 268 shows an alternate method of switching capacitors to create a staircase-like ramp of voltage similar to that created by circuit 140 in FIG. 5. The present example shows the use of 3 capacitors and associated circuitry to create an 8 step ramp. In a similar manner one may use more capacitors to create a ramp with more steps, or fewer capacitors to create a ramp with fewer steps. In general, if N capacitors are used, there will be $2^N$ steps per ramp in this type of cyclic power supply. Four-bit up/down counter 270 is connected by lead 285 to a CLOCK signal and by lead 286 to a CLEAR signal. The UP/DOWN control input to counter 270 is connected by lead 287 to the Q output of latch 271, which controls whether the counter will count up or down. The least significant bit output of counter 270, and its complement are attached to leads 290 and 291 respectively. The next higher bit output of counter 270, and its complement are attached to leads 292 and 293 respectively. The next higher bit output of counter 270, and its complement are attached to leads 294 and 295 respectively. The most significant bit output of counter 270, and its complement are attached to leads 296 and 297 respectively. The Reset input of latch 271 is connected to lead 296, the most significant bit output of counter 270, thus causing the counter to begin counting down when it reaches the binary state '1000'. The Set input of latch 271 is connected through lead 288 to the output of 4-input AND gate 272. The inputs of AND gate 272 are connected to the four complement outputs of counter 270 through leads 291, 293, 295, and 297, thus causing the counter to begin counting up when it gets down to the binary state '0000'.

FETs 274–279 are used to switch capacitors 281–283 in and out of a series arrangements. The gates of FETs 274–278 are connected to the outputs of counter 270 through leads 290–294, while the gate of FET 279 is connected to the output of 2-input NOR gate 273. The inputs of NOR gate 273 are connected by leads 294 and 296 to the outputs of the third and fourth bits of counter 270. The sources of FETs 274 and 275 are connected to ground through lead 301. The drain of FET 275 is connected through lead 302 to one side of capacitor 281 and to the sources of FETs 276 and 277. The drain of FET 277 is connected through lead 303 to one side of capacitor 282 and to the sources of FETs 278 and 279. The drain of FET 279 is connected through lead 300 to one side of capacitor 283, to the drain of FET 280, and to the OUTPUT terminal. The drain of FET 274 is attached to the other side of capacitor 281 through lead 304. The drain of FET 276 is attached to the other side of capacitor 282 through lead 305. The drain of FET 278 is attached to the other side of capacitor 283 through lead 306. The source of FET 280 is connected by lead 299 to a positive voltage, $V_{SUPPLY}$, and the gate of FET 280 is connected to lead 297.

For simplicity, FETs 274–279 are shown as n-channel FETs, and FET 280 is chosen to be a p-channel FET. As an extension, the circuit could also be built using pFETs or transmission gates (an nFET and a pFET in parallel) in place of some of the nFETs, changing the control circuitry to provide the complementary gate signals as needed, to lower the resistivity of some of the switches.

In operation of FIG. 7, the capacitors 281–283 have capacitance larger than that of the load being driven on line 300, and are charged to voltages of approximately $V_{SUPPLY}/8$, $V_{SUPPLY}/4$, and $V_{SUPPLY}/2$, respectively. The voltages do not need to be preset to these levels; the capacitors will automatically stabilize to them after the circuit has made sufficient cycles. When a given bit of the counter is '1', the corresponding capacitor is connected by FET 274,276, or 278 into a series arrangement of capacitors connected between ground and the output, and when that bit is '0' the corresponding capacitor is omitted from the series stack, with FET 275,277, or 279 turned on in its place. For example, when counter 270 is in binary state '0101', FETs 274,277, and 278 are turned on and FETs 275, 276, 279, and 280 are off, connecting capacitors 281 and 283 in series between ground and the output, thus creating an output voltage of $0.625 \times V_{SUPPLY}$. If One is ramping up, the cycle begins with the counter in state '0000', with FETs 275, 277, and 279 turned on, connecting the output to ground. The counter counts up, switching the capacitors in and out in a binary fashion until it reaches the state '0111', at which time FETs 274, 276, and 278 are on, connecting all three capacitors in series and creating an output voltage of $0.875 \times V_{SUPPLY}$. Next the counter goes to the state '1000', turning on FET 280, which pulls the output up to the positive supply. FET 279 is kept off in this state by the use of NOR 273. Since lead 296 is high in this state, latch 271 resets to low causing the counter to begin counting back down. As it ramps down, the capacitors regain the charge they lost during the ramp up, and when the state reaches '0000' latch 271 is set again, in preparation for another ramp up. The cycle can be stopped at this time, or at any time, by stopping the clock signal.

FIG. 8 is a schematic circuit 201 of a third embodiment of an energy conserving cyclic power source using an inductance, which is similar to prior art schemes. It can provide a cycle of current through a switch to a bit line wherein the capacitance of the bit line is charged and discharged with minimum voltage across the switch. Cyclic power source 190 has a DC power supply 192, with an output voltage $V_{BL}$, which is coupled over lead 193 to one side of capacitor 194 and to the source of transistor 195. Lead 193 is also coupled to the source of transistor 202. The other side of capacitor 194 is coupled over lead 196 to the drain of transistor 195 and to one side of inductor 197. The other side of inductor 197 is coupled through lead 199 to the drain of transistor 202, and functions as a output of cyclic power supply 190. From there, lead 199 is coupled through switch 204 to one side of the load capacitor represented by capacitor 203 which may be for example a set of bit lines. Capacitor 203 may have a value of a 100 picofarads. Switch 204 may, for example, be an FET such as transistor 77 in FIG. 1. The other side of load capacitor 203 is connected through lead 206 to a DC return path such as ground, as shown in FIG. 8. The gates of transistors 195 and 202 are coupled over lead 200 to signal SUPPLY RESET. The inductance of inductor 197 and the capacitance of capacitor 194 are selected for coupling to the load capacitance 203 wherein capacitor 194 may be substantially equal to the load capacitance 203. Capacitor 194 may be for example a 100 picofarads. Inductor 197 may be for example 100 micro-Henrys. The cycle time T is determined by the LC resonance, and is approximately given by $2\pi\sqrt{LC}$ where L is the inductance of inductor 197 and C is the capacitance of capacitor 194 in series with the load capacitance 203. The inductor 197 may be for example a ferrite toroid.

Figure 9:
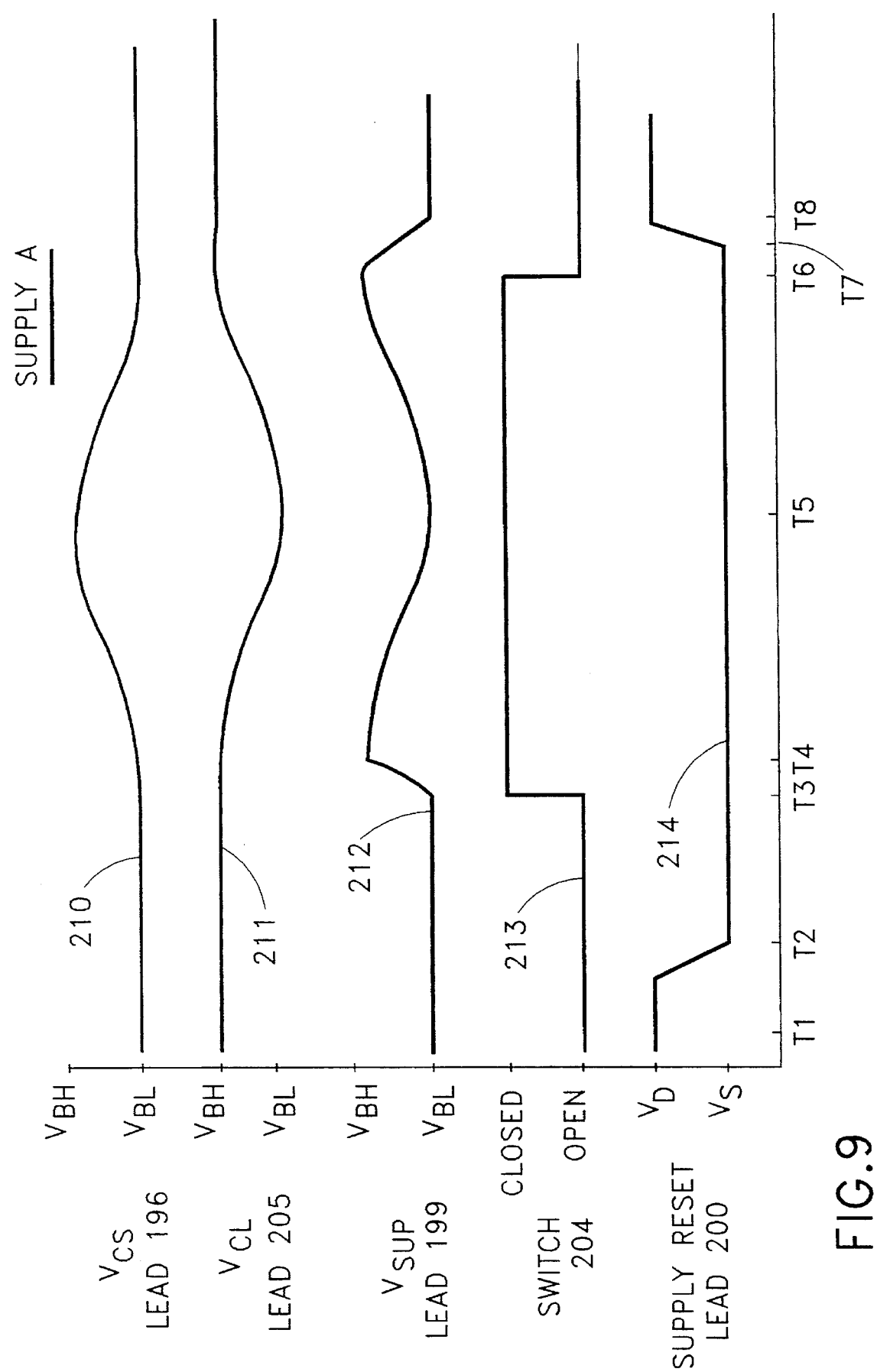
FIG. 9 shows typical waveforms for operation of the energy conserving cyclic power source shown in FIG. 8.

FIG. 9 shows typical waveforms for operation of cyclic power supply 201 shown in FIG. 8. At time T1, signal SUPPLY RESET is high causing transistors 195 and 202 to be conducting. Capacitor 194 is fully discharged and leads 193, 196 and 199 are all at the same potential $V_{BL}$. Capacitor 203 and lead 205 have previously been precharged to a positive voltage $V_{BH}$. At time T2 signal SUPPLY RESET goes to zero causing transistors 195 and 202 to be non-conducting. At time T3 switch 204 is closed coupling lead 205 to lead 199. Lead 199 goes to the voltage of lead 205, which is $V_{BH}$, at time T4. Inductor 197 begins to conduct current discharging capacitor 203 and charging capacitor 194 which causes the voltage on lead 196 to increase to a maximum at time T5. Time T5 also corresponds to a minimum of voltage on leads 205 and 199 caused by the discharge of capacitor 203. The minimum voltage on lead 199 is approximately given by $$\frac{2C_S V_{BL} + (C_L - C_S)V_{BH}}{C_L + C_S}$$

and the maximum voltage on $$\frac{(C_S - C_L)V_{BL} + 2C_L V_{BH}}{C_L + C_S},$$

lead 196 is approximately given by
where $C_s$ is the capacitance of capacitor 194 and $C_L$ is the capacitance of capacitor 203. If $C_{L=C_s}$ then these equations simplify, and the minimum voltage on lead 199 is just $V_{BL}$ and the maximum voltage on lead 196 is just $V_{BH}$, as shown in FIG. 9. After time T5 the current through inductor 197 begins to flow in the opposite direction, causing the voltage on lead 205 to increase as capacitor 194 discharges back through inductor 197 into capacitor 203. When capacitor 203 is fully charged back to nearly $V_{BH}$ at time T6, switch 204 opens. At time T7 signal supply RESET goes high causing transistors 195 and 202 to be conducting causing the voltage on lead 199 as well as the voltage on lead 196 to go to $V_{BL}$, which is the voltage on lead 193, at time T8 completing one cycle of cyclic power supply 201. Very little power is dissipated in this cycle since all resistive voltage drops are kept small. For example, the total of all resistive voltage drops are less than 50 percent of the supply voltage.

Figure 10B:
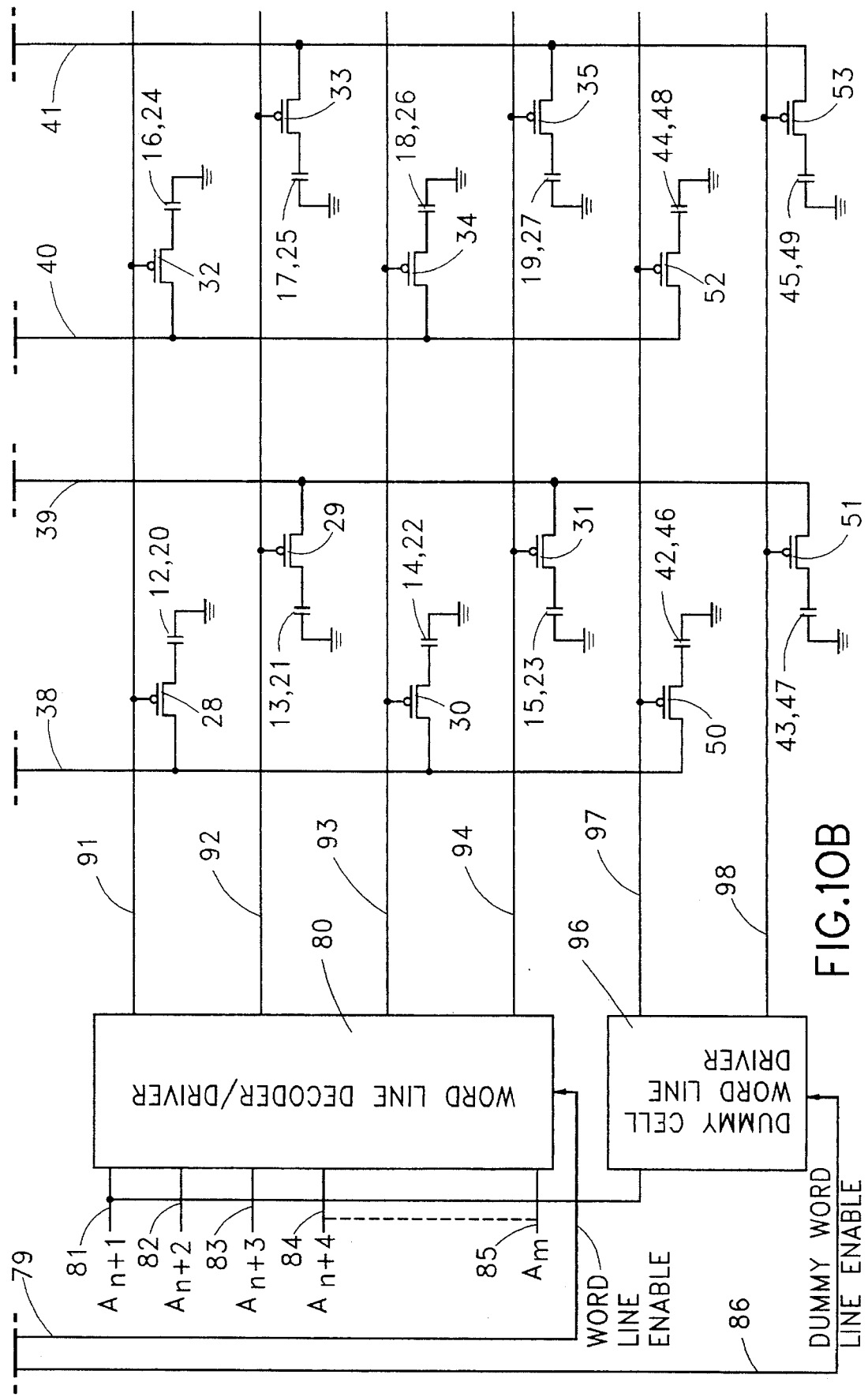

FIGS. 10A and 10B is a second embodiment of the invention which differs from that of FIG. 1 by having the bit lines precharged to an intermediate level between $V_{BH}$ and $V_{BL}$, such as $\frac{1}{2}(V_{BH}-V_{BL})$. In FIG. 10 like references are used for functions corresponding to the apparatus of FIGS. 1A and 1B. Energy conserving cyclic power source 310 provides a negative going waveform such as from $$\frac{1}{2}(V_{BH}+V_{BL})$$

to $V_{BL}$ and back to $$\frac{1}{2}(V_{BH}+V_{BL}).$$

The output of energy conserving cyclic power source 310 is coupled over lead 311 through transistor 312 to lead 313. The gate of transistor 312 is coupled over lead 229 to signal ACTIVATE. Cyclic power source 74 may for example provide a positive going waveform from $$\frac{1}{2}(V_{BH}+V_{BL})$$

to $V_{BH}$ and back to $$\frac{1}{2}(V_{BH}+V_{BL}).$$

Cyclic power source 74 is coupled over lead 230 through transistor 314 to lead 315. The gate of transistor 314 is coupled over lead 316 to signal ACTIVATE. Lead 313 is coupled to the source of transistors 321 through 324. Lead 315 is coupled to the source of transistors 325 through 328. The drain of transistors 321 and 325 are coupled to lead 38 and the drain of transistors 322 and 326 are coupled to lead 39. The drain of transistors 323 and 327 are coupled to lead 40 and the drain of transistors 328 and 324 are coupled to lead 41. The gate of transistors 321 and 325 are coupled to lead 221. The gate of transistors 326 and 322 are coupled to lead 218. The gate of transistors 323 and 327 are coupled to lead 225 and the gate of transistors 328 and 324 are coupled to lead 223. Transistors 321, 322, 325 and 326 function to connect leads 313 and 315 to leads 38 and 39 respectively or vice-versa as a function of the data sensed on sense amp/latch 58. The sensed data appears on lead 218 and 221. Transistors 323, 324, 327 and 328 function to connect leads 313 and 315 to leads 40 and 41 respectively or vice-versa as a function of the data sensed on sense amp/latch 59. The sensed data appears on leads 223 and 225.

In operation after data from bit lines 38 and 39 have been sensed, leads 313 and 315 are coupled to bit lines 38 and 39 respectively if the data, for example, is a one and vice-versa if the data is a zero. ACTIVATE signal goes high connecting cyclic power source 74 to lead 315 and cyclic power source 310 to lead 313. The waveforms from cyclic power sources 74 and 310 pass through to bit lines 38 and 39 respectively or vice-versa depending on the data sensed and to bit lines 40 and 41 respectively or viceversa depending upon the data sensed. When the waveforms from cyclic power source 74 and cyclic power source 310 reach the appropriate voltage to be stored in the memory cell capacitor or dummy cell capacitor, the selected word line is deselected or goes high turning off the memory cell transistor, for example, transistor 28 and leaves the voltage on the memory cell capacitor 20 which is refreshed to the desired voltage. The waveforms continue to cycle causing the charge stored on the bit line with the highest voltage to flow back into cyclic power source 74, while the bit line with the lowest voltage will gain charge back from cyclic power source 310. In this manner the bit lines and the cyclic power supplies recover substantially all the energy transferred from one to the other and back over the cycle. The cycle ends with the bit lines restored to nearly the original voltage level $\frac{1}{2}(V_{BH}+V_{BL})$. The bit lines can be connected to the sense amplifier/latches by turning on transistors 217, 220, 222, and 224 with the connect signal, and the sense nodes can be rebalanced. For this purpose sense amplifier/latch circuits 58 and 59 are the same as the circuit shown in FIG. 3 except that transistors 137 and 138 are deleted. Asserting Reset at the end of the cycle will turn on transistor 139 and rebalance both the sense amplifier/latches and the bit lines connected to them to the original precharge level.

The word line may be deselected by signal WORD LINE ENABLE on lead 79. DC power source 70 is coupled over lead 331 through transistor 332 to lead 71 and functions to provide a voltage to sense amp/latch 58 and 59. The gate of transistor 332 is coupled over lead 333 to signal $\overline{\text{ENABLE}}$. Signals ENABLE and $\overline{\text{ENABLE}}$ function to couple DC power source 234 which may be, for example, at a negative voltage or at ground potential and DC power source 70 which may be, for example, at 3.3 volts to respective terminals of sense amp/latch 58 and 59. At the time of signal ENABLE, sense amp/latch 58 and 59 sense the potential on bit lines 38 through 41. Memory controller 68 functions to provide the respective control signals at the appropriate times.

In an alternate embodiment of FIGS. 10A and 10B energy conserving cyclic power supplies 74 and 310 may be replaced with dc power sources 88 and 89 respectively, to leads 230 and 311. Each power source 88 and 89 would charge the respective bit line it was connected to to a voltage equal to $V_{BL}$ and $V_{BH}$ respectively corresponding to data of zero and one respectively. The use of power sources 88 and 89 would save some energy if the bit line voltage swing is smaller than previously necessary. If energy conserving cyclic power sources 74 and 310 are used, more energy would be saved because the energy would be recovered by the power sources 74 and 310. Also the use of dc power sources 88 and 89 allows the refresh operation to be faster since there is no slowly varying waveform in this case. Thus, dc sources can be used when fast operation is needed, for random data selection for example. The energy conserving cyclic supply can be used in situations where the refresh time is relatively unimportant, such as for page mode or for sleep mode.

Figure 11A:
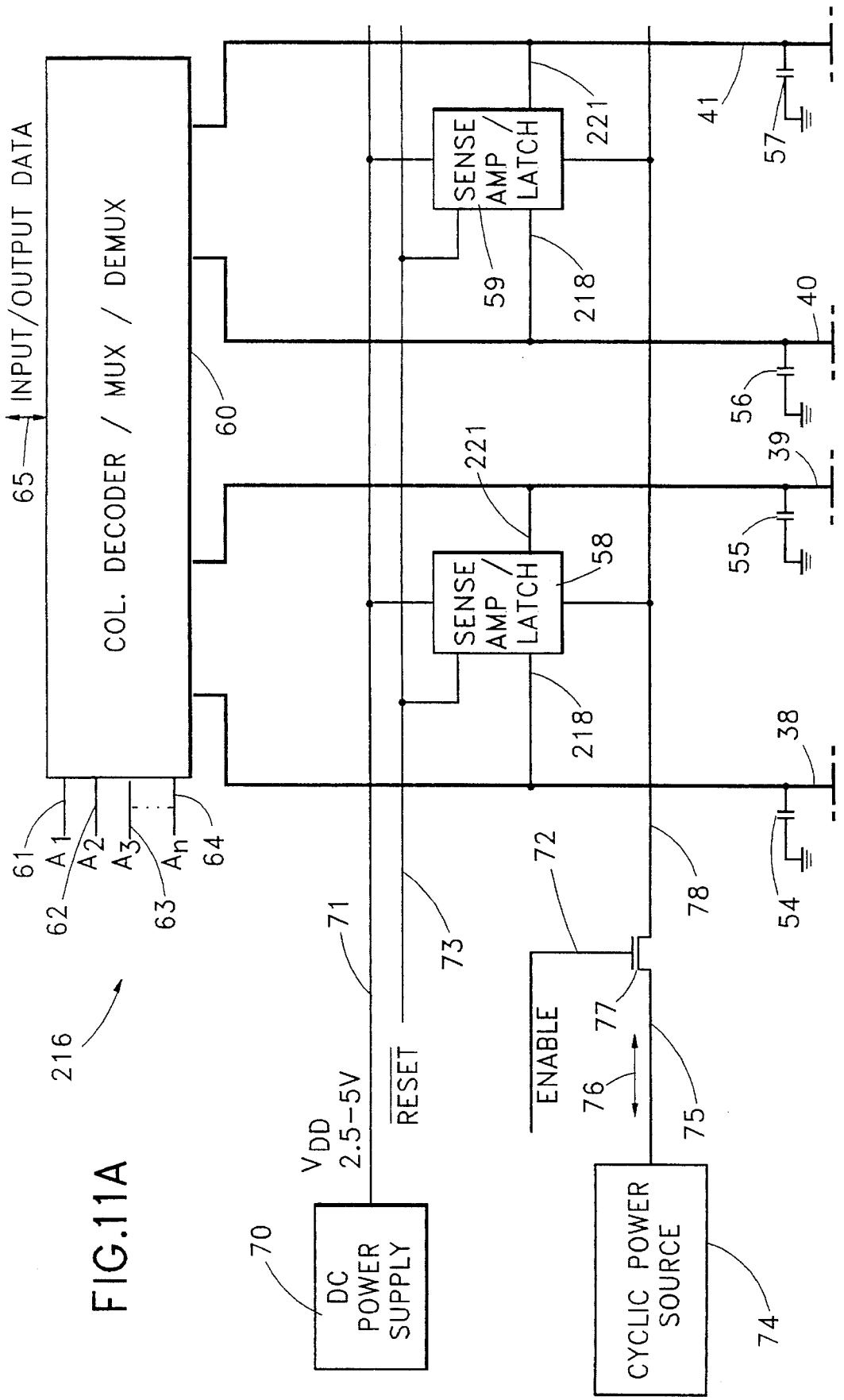

FIGS. 11A and 11B is a third embodiment of the invention. In FIG. 11 like references are used for functions corresponding to the apparatus of FIGS. 1A and 1B. Bit lines 38 and 39 which are coupled to two respective columns of memory cells are coupled directly to respective inputs of sense amplifier and latch 58. Bit lines 40 and 41 which are coupled to two respective columns of memory cells are coupled directly to respective inputs of sense amplifier and latch 59. Bit lines 38–41 are also coupled to respective inputs or outputs of column decoder/multiplexer/demultiplexer 60.

An energy conserving cyclic power source 74 is coupled over lead 75 to the source of FET 77. The drain of transistor 77 is coupled over lead 78 to sense amplifier and latches 58 and 59. Cyclic power supply 74 functions to provide a voltage-current waveform to bit lines 38–41 by way of sense amplifier and latches 58 and 59 and recovers the current back to cyclic power source 74 which results in a current passing in both directions as shown by arrow 76. ENABLE signal on lead 72 switches FET 77 on to select semiconductor memory 10 to receive power which may be a portion of a total memory system. Other Enable signals may select other semiconductor memories 10 in the memory system in the same manner to connect them to cyclic power source 74 at appropriate times.

Figure 12:
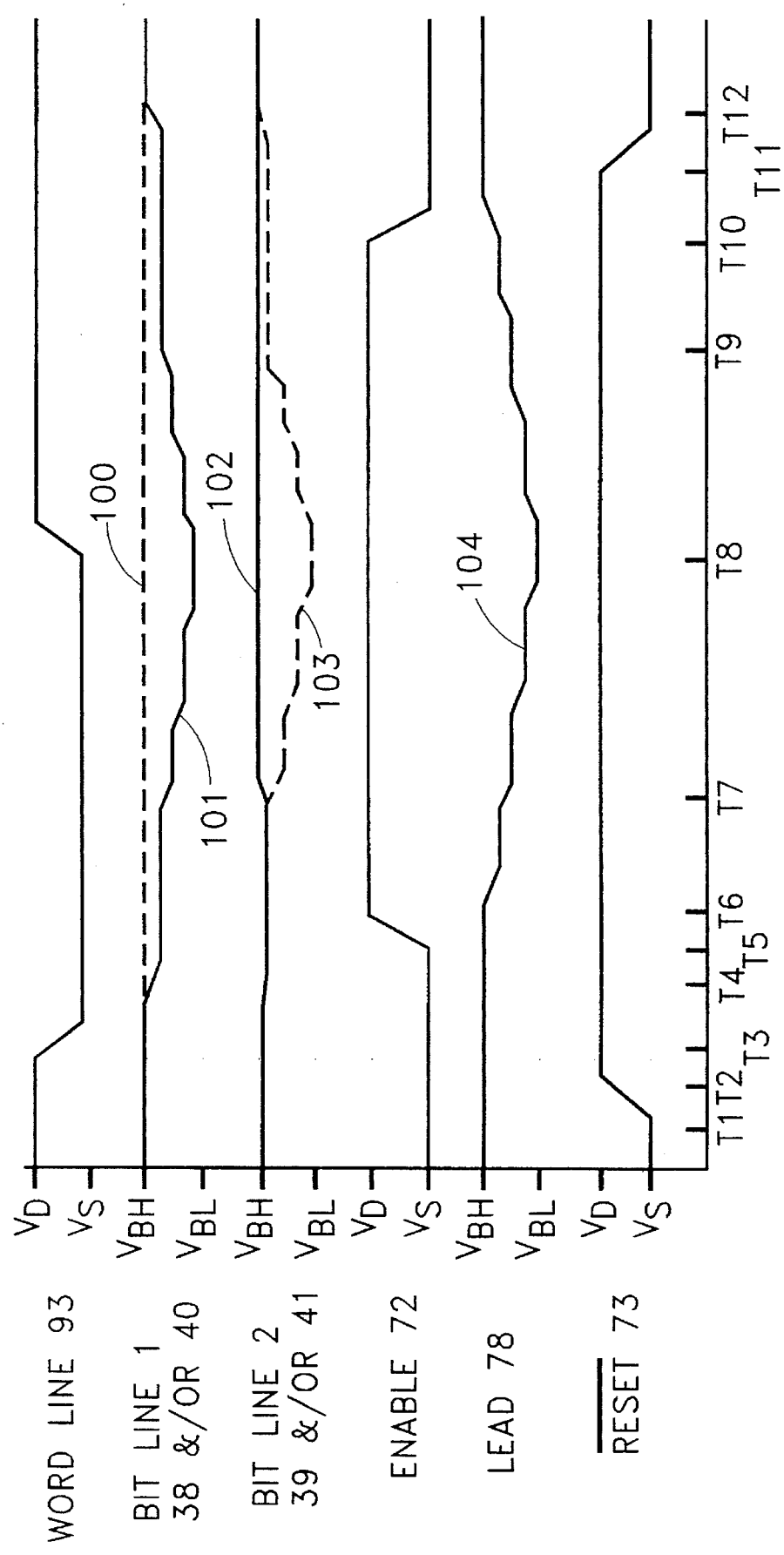
FIG. 12 shows typical waveforms for operation of the third embodiment shown in FIG. 11.

FIG. 12 shows typical waveforms for semiconductor memory 216 shown in FIGS. 11A and 11B. These waveforms correspond to a single cycle of reading or refreshing the data in a memory cell. At time T1, before the cycle begins, RESET is high, the word lines 91–94, 97, 98 are all high, and the bit lines 38–41 are precharged to $V_{BH}$. At time T2, the RESET signal is brought low, disconnecting the bit lines 38–41 from their DC power source 70. At time T3 one of the dummy cell word line 98 are enabled and drop to a low level, turning on FETs 30, 34, 51, and 53 in memory cells 14 and 18, and dummy cells 43 and 45 respectively. When these FETs are turned on, the charge in storage capacitors 22, 47, 26, and 49 is transferred onto bit lines 38–41 respectively, resulting in small voltage signals on the bit lines at time T4. If the data stored in cell 14 or 18 is represented by a high voltage on the respective storage capacitor, then waveform 100 results for the bit line coupled to that cell, while if the data is represented by a low voltage, then waveform 101 results for the bit line coupled to that cell. Since the capacitors in the dummy cells are only charged to $V_{DD}/2$ (using circuitry not shown), the signal on bit lines 39 and 41 is only half as large as that of waveform 101.

At time T5 reading or refreshing of the memory is enabled by turning on FET 77. At time T6 cyclic power source 74 begins to ramp from $V_{BH}$ toward $V_{BL}$. This may be in response to the ENABLE signal or it may be controlled by other signals within the cyclic power source. The waveform shown (104) corresponds to that of the cyclic power source described in FIG. 5. When the output of the cyclic power source has dropped down to a level of about $V_{BH}-V_T$ (where $V_T$ is the threshold voltage of the FETs), at time T7, each sense amplifier/latch is able to sense the polarity of the difference in voltage between its two bit line inputs, 38 and 39, or 40 and 41. In doing so, it latches to the data, pulling the lower of its two inputs down to the level of the cyclic power source lead 78. The higher of the two inputs becomes connected to $V_{BH}$ on lead 71 from dc power supply 70. This latching process takes energy of approximately $C(V_{BH}-B_{BL}-V_T 2)V_T$ where C is the capacitance of a bit line.

As the cyclic power source continues to ramp down to its minimum voltage, it adiabatically discharges the bit lines 38 or 39, and 40 or 41, with very small voltage drops across transistor 77 and the FETs 132 or 135 in the sense amplifier/latches and correspondingly very little energy dissipation. When the cyclic power source 74 reaches its minimum output voltage at time T8, the word line 93 is switched back to the high state, turning off FETs 30 and 34, leaving the rewritten data stored as the charge state of the capacitors 22 and 26. If a read operation is being performed, column decoder/multiplexer/demultiplexer 60 is employed at time T8 to obtain the desired output data. After time T8, cyclic power source 74 ramps the voltage on lead 78 and on bit lines 38 or 39, and 40 or 41, back toward $V_{BH}$, adiabatically charging the capacitances of the bit lines, and hence dissipating very little energy. At time T9 the cyclic power source 74 reaches a voltage level of about $V_{BH}-V_T$ and FETs 132 or 135 in the latches cease to conduct. This leaves the bit lines 38 or 39, and 40 or 41, isolated at a voltage level of about one threshold voltage below $V_{BH}$.

At time T10 the ENABLE signal is removed and the cyclic power supply 74 ceases ramping. At time T11 the RESET signal is applied, resulting at time T12 in the bit lines 38–41 all being pulled up to $V_{BH}$. This causes energy dissipation of about $CV_T^2/2$ for each of the two bit lines 38 or 39, and 40 or 41, that were floating at $V_{BH}-V_T$. At this point the read or refresh cycle is finished. The voltage in the dummy cells must be returned to $(V_{BH}+V_{BL})/2$ before the next cycle is started. The energy dissipation for this cycle has only been approximately $C(V_{BH}-V_{BL})V_T$ per bit line pair, which should be compared to $C(V_{BH}-V_{BL})^2$ that would have been dissipated if adiabatic charging had not been used. Since $V_T$ is typically ¼ of the voltage swing $(V_{BB}-V_{BL})$, this may represent a 75% savings in energy consumption.

The embodiment of FIGS. 11A and 11B is relatively simple to implement but is not as efficient as the embodiments of FIGS. 1, 10A and 10B. It may be desirable to employ the semi-adiabatic scheme for setting the sense amplifier/latch described with respect to FIGS. 11A and 11B to the circuits of FIGS. 1, 10A and 10B. This can be done for FIGS. 1A and 1B by using an energy conserving power source such as 74 in place of the dc power source 234. The same substitution can be made in FIGS. 10A and 10B where dc power source 70 would also be replaced by an energy consuming power source similar to that of 310. These changes would allow the sense amplifier/latches and all their associated output lines to be driven in a semi-adiabatic way, thereby conserving a substantial portion of the energy which would otherwise be lost.

While there has been described and illustrated a semiconductor memory having an energy storage network for adiabatically switching signal lines such as a bit line and a method for operating a semiconductor memory for example a dynamic random access memory (DRAM), it would be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A semiconductor memory comprising:

a plurality of memory cells arranged in an array, each memory cell connected to a word line and a bit line, a plurality of sense amplifiers, each said sense amplifier coupled to a respective bit line for sensing data on said bit line at times when a memory cell coupled to said bit line is selected by a respective word line, a first energy storage network for providing a voltage waveform to said bit line for writing or rewriting data into one or more memory cells, and a first switch for coupling said first energy storage network to one or more said bit lines whereby any energy put into the capacitance of said one or more bit lines during writing or rewriting of data into said memory cell by said first energy storage network is substantially recovered by said first energy storage network and any energy taken out of the capacitance of said one or more bit lines during writing or rewriting of data into said memory cell is substantially put back by said first energy storage network.

2. The semiconductor memory of claim 1 further including circuitry for closing said first switch in response to a signal indicative of the data on said bit line sensed by said sense amplifier.

3. The semiconductor memory of claim 1 further including a second energy storage network, a second switch for coupling said second energy storage network to said one or more of said bit lines, and a second bit line coupled to memory cells not coupled to said other bit line and wherein third and fourth switches couple said second bit line to one of said first and second energy storage networks.

4. The semiconductor memory of claim 3 wherein said one of said first and second energy storage networks coupled to said second bit line provides a voltage waveform to said second bit line in response to the data state to be written or re-written on said second bit line.

5. The semiconductor memory of claim 3 wherein said first and second energy storage networks provide voltage waveforms to said second bit line in positive and negative going voltage waveforms, respectively.

6. The semiconductor memory of claim 1 wherein said semiconductor memory is a dynamic random access memory.

7. The semiconductor memory of claim 1 wherein said first switch includes a field effect transistor.

8. The semiconductor memory of claim 1 wherein said first energy storage network includes an inductor having a value to substantially control the rate of charging and discharging of said bit line.

9. The semiconductor memory of claim 1 wherein said first energy storage network includes a capacitor and inductor in series having values to substantially control the rate of charging and discharging of said bit line.

10. The semiconductor memory of claim 9 wherein said capacitor in said first energy storage network coupled to one or more bit lines has a value in the range from 0.7 to 1.3 times the value of the capacitance of said one or more bit lines.

11. The semiconductor memory of claim 1 wherein said first energy storage network includes a plurality of capacitors and switches.

12. The semiconductor memory of claim 1 wherein said first energy storage network includes a plurality of capacitors, a plurality of switches, and a counter for controlling said switches.

13. The semiconductor memory of claim 1 wherein said first energy storage network provides a sine wave voltage waveform.

14. The semiconductor memory of claim 1 further including control circuitry for generating a first control signal for closing said first switch at selected times.

15. The semiconductor memory of claim 14 further including a word line decoder for selecting one of a plurality of word lines in response to address signals and a word line enable signal, said word line enable signal generated by said control circuitry and going to a voltage level after a first time period to deselect said one of a plurality of word lines after said first control signal closes said first switch.

16. The semiconductor memory of claim 1 further including control circuitry for generating a control signal for closing said first switch after said data on said bit line has been sensed by a sense amplifier coupled to said bit line.

17. The semiconductor memory of claim 1 further including a bit line driver including said first switch and a second switch, said second switch coupled between said first energy storage network and a second bit line coupled to memory cells not coupled to said other bit line.

18. The semiconductor memory of claim 1 further including a second energy storage network and a second switch for coupling said second energy storage network to said one or more of said bit lines.

19. The semiconductor memory of claim 1 wherein each said sense amplifier has two supply terminals, and said first switch connecting said first energy storage network to one of said supply terminals on each of said sense amplifiers, whereby the energy from said first energy storage network reaches said bit lines by passing through said switch and through said sense amplifiers.

20. The semiconductor memory of claim 19 further including a second energy storage network and a second switch connecting said second energy storage network to the other of said supply terminals on each of said sense amplifiers.

21. The semiconductor memory of claim 1 further including a plurality of switches, said first switch being one of said plurality of switches, each switch coupling said first energy storage network to a respective bit line.

22. The semiconductor memory of claim 21 wherein each of said switches is controlled by the respective sense amplifier that is coupled to the same bit line as said switch.

23. The semiconductor memory of claim 1 wherein said plurality of memory cells arranged in an array are arranged in columns and rows and further including a plurality of word lines, each said word line coupled to a respective row of memory cells, and further including one or more bit lines, each said bit line coupled to a respective column of memory cells.

24. A semiconductor memory comprising:
a plurality of memory cells arranged in an array,
each memory cell connected to a word line and a bit line,
a plurality of sense amplifiers, each said sense amplifier coupled to a respective bit line for sensing data on said bit line at times when a memory cell coupled to said bit line is selected by a respective word line,
a first switch adapted for coupling a first energy storage network to one or more of said bit lines for providing a voltage waveform to said bit line for writing or rewriting data into one or more memory cells whereby any energy put into the capacitance of said one or more bit lines during writing or rewriting of data into said memory cell by said first energy storage network is substantially recovered by said first energy storage network and any energy taken out of the capacitance of said one or more bit lines during writing or rewriting of data into said memory cell is substantially put back by said first energy storage network.

25. The semiconductor memory of claim 24 further including circuitry for closing said first switch in response to a signal indicative of the data on said bit line sensed by said sense amplifier.

26. A semiconductor memory comprising:
a plurality of memory cells arranged in columns and rows,
a plurality of word lines, two word lines for each said row, the first word line in each row coupled to the odd numbered memory cells in said row, the second word line in each row coupled to the even numbered memory cells in said row,
a plurality of bit lines,
a plurality of sense amplifiers, each sense amplifier coupled to a pair of respective bit lines for sensing data on said bit lines at selected times,
a first energy storage network for providing a voltage waveform to one or more of said bit lines for writing or rewriting data into selected memory cells, and
means for coupling said first energy storage network to said bit lines,
whereby any energy put into the capacitance of said bit lines during the writing or rewriting of data into said selected memory cells is substantially recovered by said first energy storage network and any energy taken out of the capacitance of said bit lines during writing or re-writing of data into said selected memory cells is substantially put back by said first energy storage network.

27. The semiconductor memory of claim 26 wherein each said sense amplifier has two supply terminals, and said means for coupling said first energy storage network to said bit lines is a switch connecting said first energy storage network to one of said supply terminals on each of said sense amplifiers, whereby the energy from said first energy storage network reaches said bit lines by passing through said switch and through said sense amplifiers.

28. The semiconductor memory of claim 27 further including a second energy storage network and a second switch connecting said second energy storage network to the other of said supply terminals on each of said sense amplifiers.

29. The semiconductor memory of claim 26 wherein said means of coupling said first energy storage network to said bit lines is a plurality of switches, each switch coupling said first energy storage network to a respective bit line.

30. The semiconductor memory of claim 29 wherein each of said switches is controlled by the respective sense amplifier that is coupled to the same bit line as said switch.

31. The semiconductor memory of claim 30 further including a plurality of de-coupling switches, each of said de-coupling switches being connected between one of said bit lines and its respective sense amplifier, whereby said sense amplifiers may be decoupled from their respective bit lines before said sense amplifiers are activated.

32. The semiconductor memory of claim 26 further including a second energy storage network and a second plurality of switches, wherein said means of coupling said first energy storage network to said bit lines is a first plurality of switches, each switch coupling said first energy storage network to a respective bit line, and wherein each switch in said second plurality of switches couples said second energy storage network to a respective bit line, whereby each said bit line may be coupled to either the first or the second energy storage network, depending on the state of the switches.

33. The semiconductor memory of claim 32 wherein each of said switches is controlled by the respective sense amplifier that is coupled to the same bit line as said switch.

34. The semiconductor memory of claim 33 further including a plurality of de-coupling switches, each of said de-coupling switches being connected between one of said bit lines and its respective sense amplifier, whereby said sense amplifiers may be decoupled from their respective bit lines before said sense amplifiers are activated.

35. The semiconductor memory of claim 26 wherein said memory cells are dynamic memory cells.

36. The semiconductor memory of claim 26 wherein said first energy storage network consists of a plurality of capacitors and a plurality of switches, said switches coupled to said capacitors so as to sequentially couple one or more capacitors to the output terminal of said first energy storage network.

37. The semiconductor memory of claim 26 wherein said first energy storage network includes an inductor.

38. A semiconductor memory comprising:

a plurality of memory cells arranged in columns and rows, the first word line in each row coupled to the odd numbered memory cells in said row, the second word line in each row coupled to the even numbered memory cells in said row, a plurality of bit lines, a plurality of sense amplifiers, each sense amplifier coupled to a pair of respective bit lines for sensing data on said bit lines at selected times, a switch means adapted for coupling a first energy storage network to one or more of said bit lines for providing a voltage waveform for writing or rewriting data into selected memory cells, whereby any energy put into the capacitance of said bit lines during the writing or rewriting of data into said selected memory cells is substantially recovered by said first energy storage network and any energy taken out of the capacitance of said bit lines during writing or rewriting of data into said selected memory cells is substantially put back by said first energy storage network.

39. A semiconductor memory comprising:

a plurality of memory cells arranged in columns and rows, a plurality of word lines, each said word line coupled to a respective row of memory cells, one or more bit lines, each said bit line coupled to a respective column of memory cells, one or more sense amplifiers, each said sense amplifier coupled to a respective bit line for sensing data on said bit line at times when a memory cell in one of said rows is selected by a respective word line, and a first energy storage network coupled through said sense amplifier to said bit line for providing a voltage waveform to said bit line for writing or rewriting data into one or more memory cells whereby any energy put into the capacitance of said one or more bit lines during writing or rewriting of data into said memory cell by said first energy storage network is substantially recovered by said first energy storage network and any energy taken out of the capacitance of said one or more bit lines during writing or re-writing of data into said memory cell is substantially put back by said first energy storage network.

40. A semiconductor memory comprising:

a plurality of memory cells arranged in columns and rows, a plurality of word lines, each said word line coupled to a respective row of memory cells, one or more bit lines, each said bit line coupled to a respective column of memory cells, a plurality of sense amplifiers, each said sense amplifier coupled to a respective bit line for sensing data on said bit line at times when a memory cell in one of said rows is selected by a respective word line, a first dc power source having a first voltage for providing said first voltage to said bit line for writing or rewriting data of a first state into one or more memory cells, a second dc power source having a second voltage for providing said second voltage to said bit line for writing or rewriting data of a second state into one or more memory cells, and a switch responsive to a signal indicative of data from one of said sense amplifiers for coupling one of said first and second dc power sources to one of said bit lines to charge the bit line to the respective voltage from said respective dc power source to recharge said memory cell to one of said first and second states.

41. A method for writing or rewriting data into a selected memory cell having a capacitance and having an input/output coupled to a bit line having a substantial capacitance greater than said memory cell capacitance comprising the steps of:

coupling said bit line to a first energy storage network for providing a voltage waveform to said bit line and deselecting said selected memory cell at a time when the voltage of said voltage waveform is at a predetermined value whereby the voltage of said voltage waveform is stored in said memory cell and is representative of said data.

42. The method of claim 41 wherein said step of coupling includes the step of closing a switch.

43. The method of claim 42 wherein said step of coupling includes providing a sine wave voltage to said bit line and remaining coupled thereto for a time period to allow recovery of the energy transferred between said energy storage network and said bit line in charging said capacitance.

44. The method of claim 41 wherein said step of coupling includes providing a cyclic voltage waveform to said bit line and remaining coupled thereto for a time period to allow recovery of the energy transferred between said bit line and said energy storage network.

45. The method of claim 41 further including the step of sensing the data stored in said selected memory cell prior to said step of coupling.

46. The method of claim 45 further including circuitry to enable said step of coupling only at times said data stored in said selected memory cell is a predetermined value.

47. The method of claim 41 further including the step of coupling a sense amplifier to said bit line to sense the data stored in said selected memory cell prior to said step of coupling and the step of decoupling said sense amplifier from said bit line prior to said step of coupling.

48. The method of claim 41 wherein said step of coupling includes the steps of coupling said bit line to a sense amplifier and coupling said sense amplifier to said first energy storage network.

49. The method of claim 41 wherein said step of deselecting includes the step of deactivating a word line decoder having a word line coupled to said selected memory cell.

* * * * *